US008426908B2

(12) United States Patent
Higashi

(10) Patent No.: US 8,426,908 B2
(45) Date of Patent: Apr. 23, 2013

(54) NONVOLATILE SEMICONDUCTOR MEMORY DEVICE AND METHOD OF MANUFACTURING THE SAME

(75) Inventor: Kazuyuki Higashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 322 days.

(21) Appl. No.: 12/875,766

(22) Filed: Sep. 3, 2010

(65) Prior Publication Data

US 2011/0057251 A1    Mar. 10, 2011

(30) Foreign Application Priority Data

Sep. 7, 2009   (JP) ................................ 2009-206007

(51) Int. Cl.
  *H01L 29/792*   (2006.01)
(52) U.S. Cl.
  USPC ................................... 257/324; 257/E29.309
(58) Field of Classification Search .................. None
  See application file for complete search history.

(56) References Cited

U.S. PATENT DOCUMENTS

| 8,237,211 B2 * | 8/2012 | Fukuzumi et al. ............ 257/315 |
| 8,264,031 B2 * | 9/2012 | Kidoh et al. ................. 257/326 |
| 2007/0252201 A1 | 11/2007 | Kito et al. |
| 2011/0057250 A1 * | 3/2011 | Higashi ....................... 257/324 |
| 2012/0003831 A1 * | 1/2012 | Kang et al. .................... 438/639 |

FOREIGN PATENT DOCUMENTS

| JP | 2007-27734 | 2/2007 |
| JP | 2007-266143 | 10/2007 |
| JP | 2008-166726 | 7/2008 |
| JP | 2008-171918 | 7/2008 |
| JP | 2009-117843 | 5/2009 |
| JP | 2009-135328 | 6/2009 |
| JP | 2009-146954 | 7/2009 |

OTHER PUBLICATIONS

U.S. Appl. No. 13/351,420, filed Jan. 17, 2012, Nikka Ko.
Office Action issued Dec. 6, 2011, in Japanese Patent Application No. 2009-206007 with English translation.

* cited by examiner

*Primary Examiner* — Benjamin Sandvik
(74) *Attorney, Agent, or Firm* — Oblon, Spivak, McClelland, Maier & Neustadt, L.L.P.

(57) ABSTRACT

A nonvolatile semiconductor memory device includes a first region having a plurality of electrically rewritable memory cells disposed therein, and a second region adjacent to the first region. The nonvolatile semiconductor memory device includes a plurality of first conductive layers, a semiconductor layer, a charge storage layer, and an insulating columnar layer. The plurality of first conductive layers are stacked in the first region and the second region, and include a stepped portion in the second region, positions of ends of the plurality of first conductive layers being different in the stepped portion. The semiconductor layer is surrounded by the first conductive layers in the first region, includes a first columnar portion extending in a stacking direction. The charge storage layer is formed between the first conductive layers and a side surface of the first columnar portion. The insulating columnar layer is surrounded by the first conductive layers in the stepped portion, and includes a second columnar portion extending in the stacking direction and comprising an insulator.

17 Claims, 32 Drawing Sheets

- W > L1 − L2
- L1 = H1 ∕ tan θ1
- L2 = H2 ∕ tan θ2

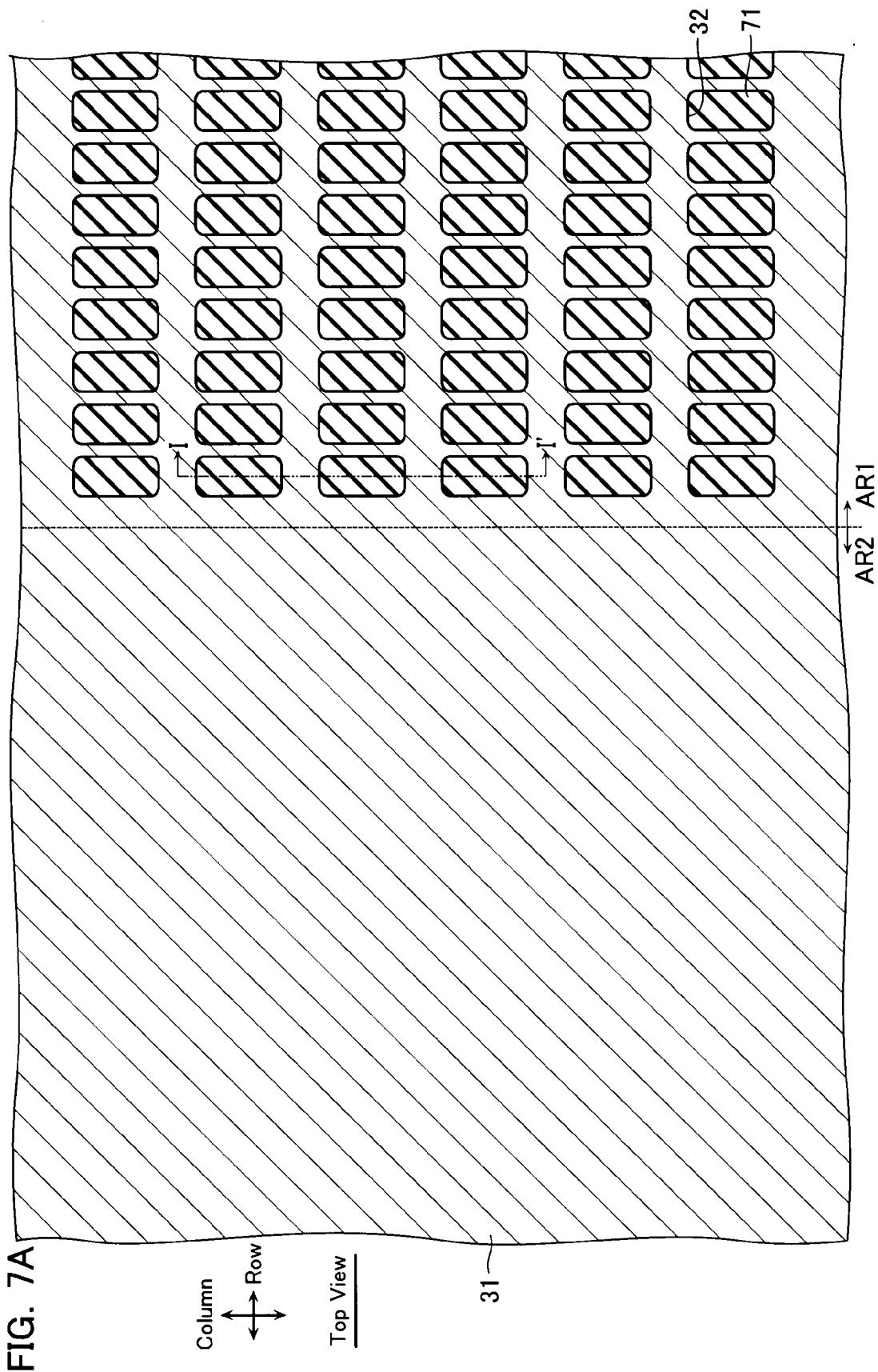

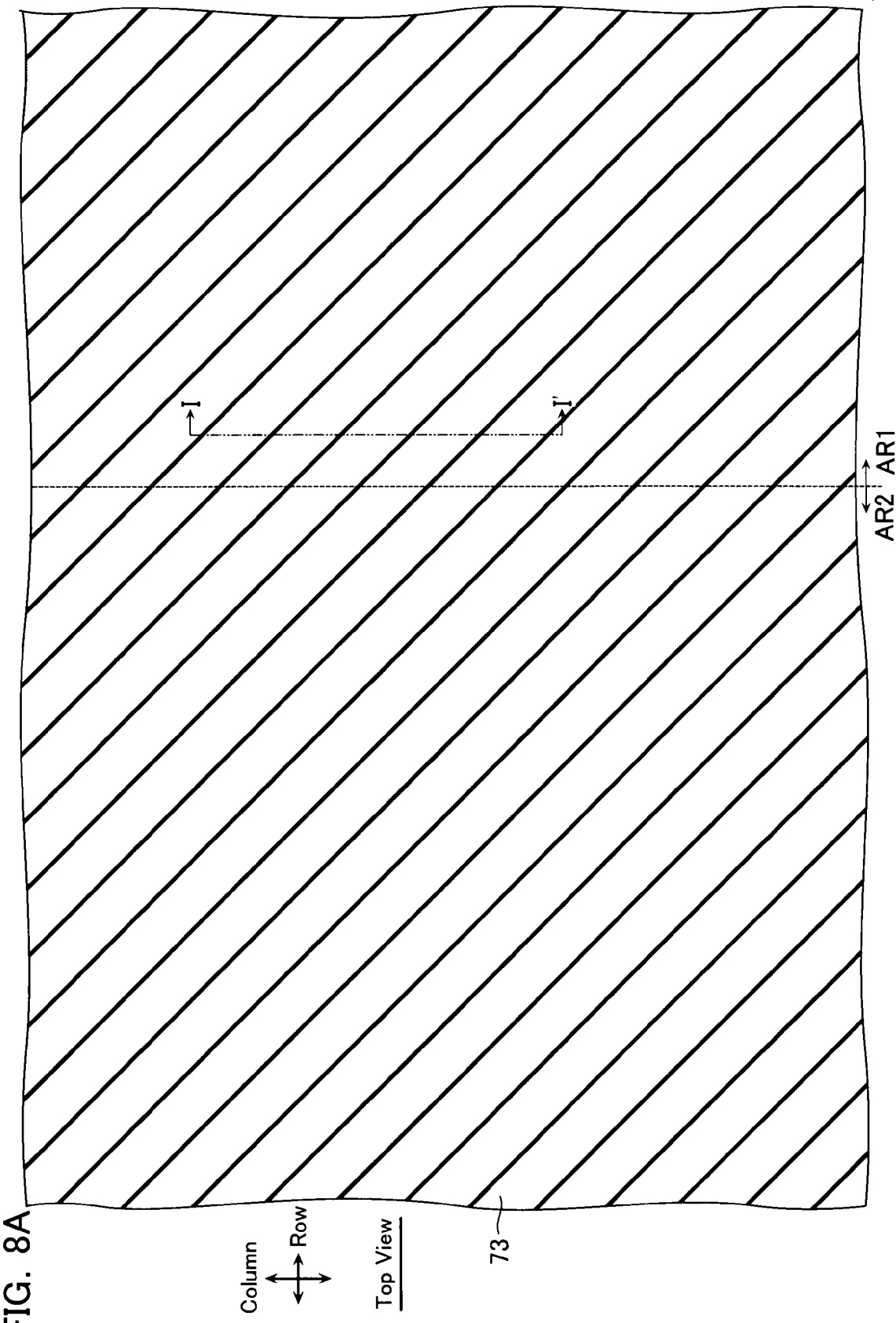

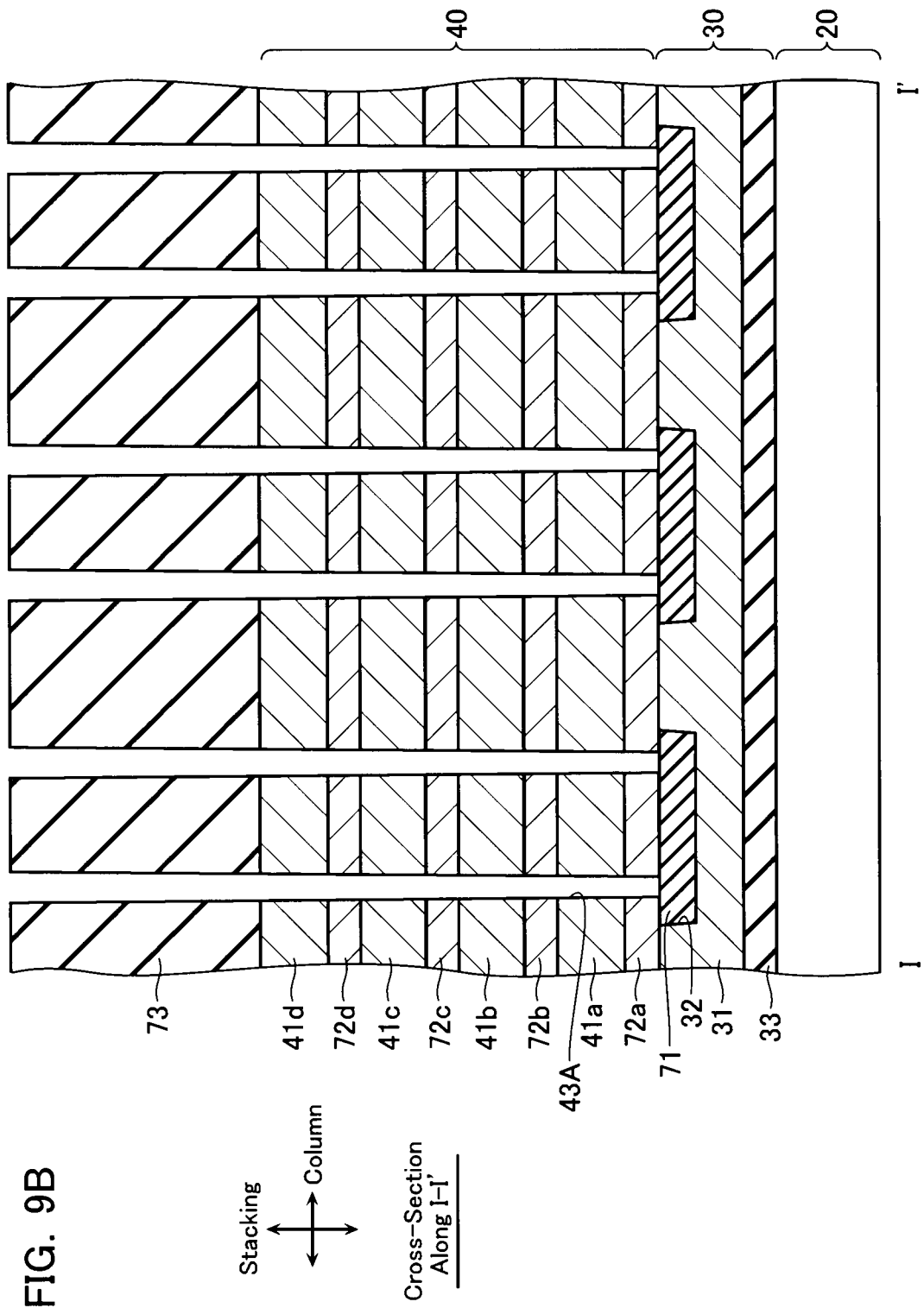

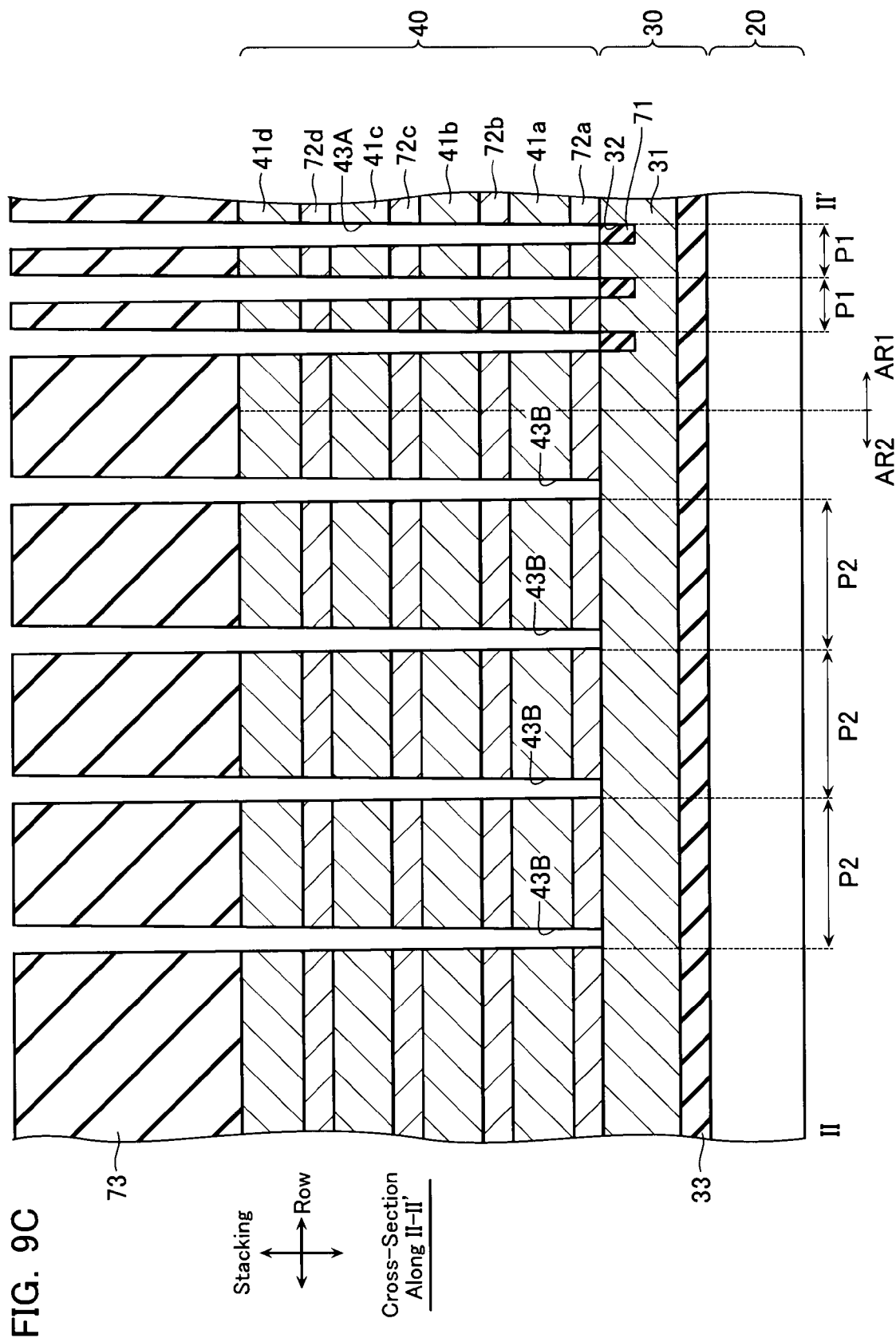

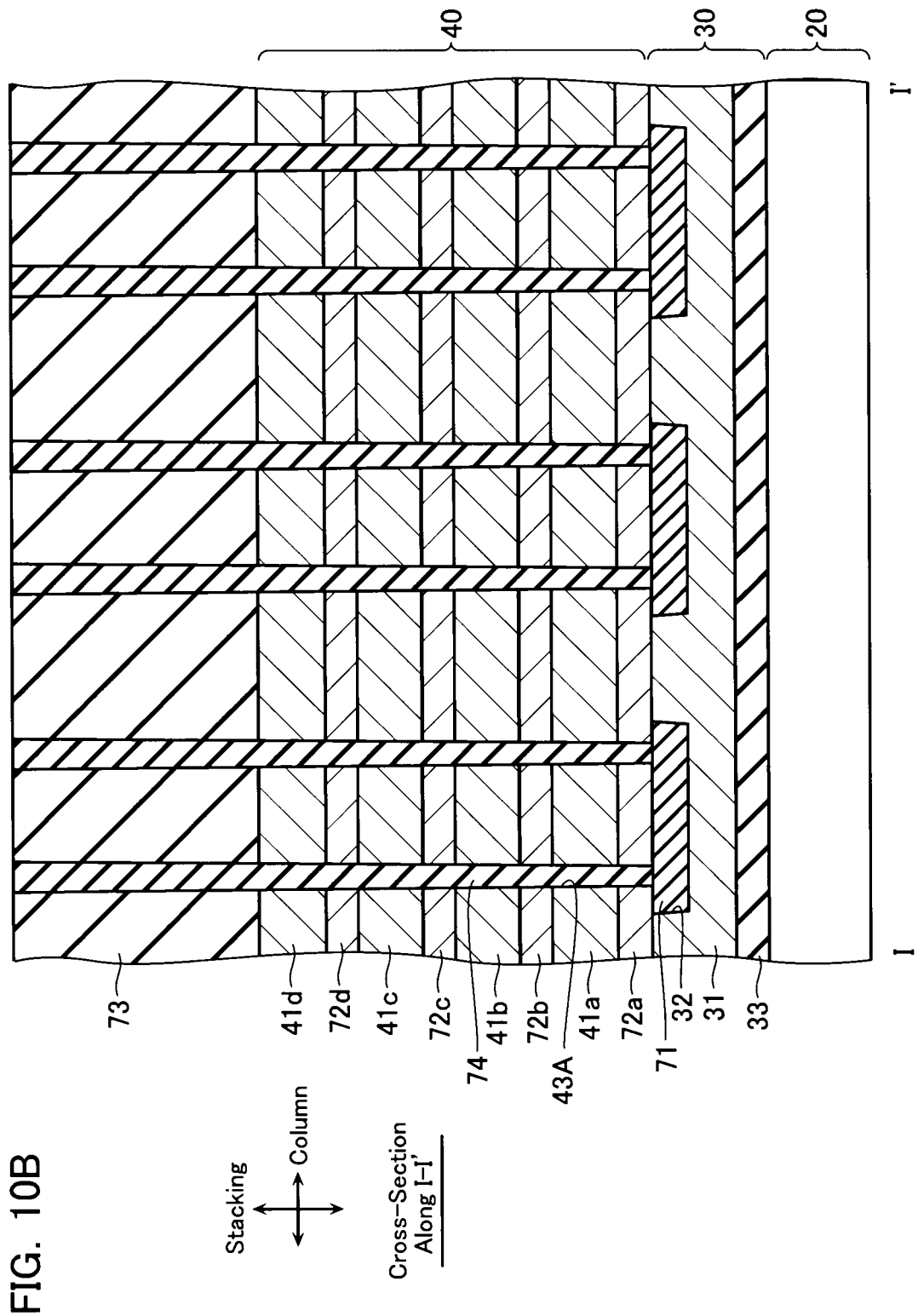

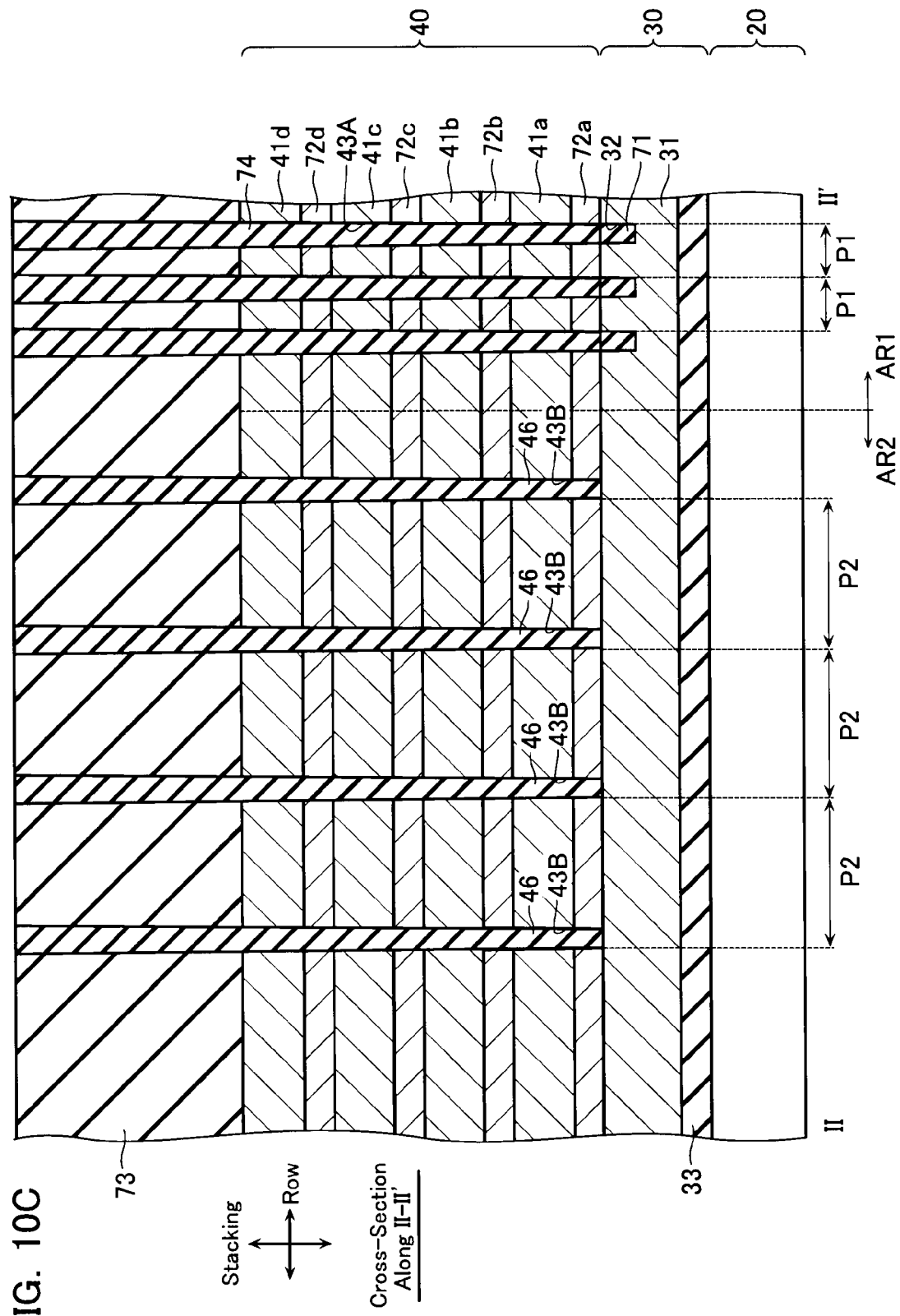

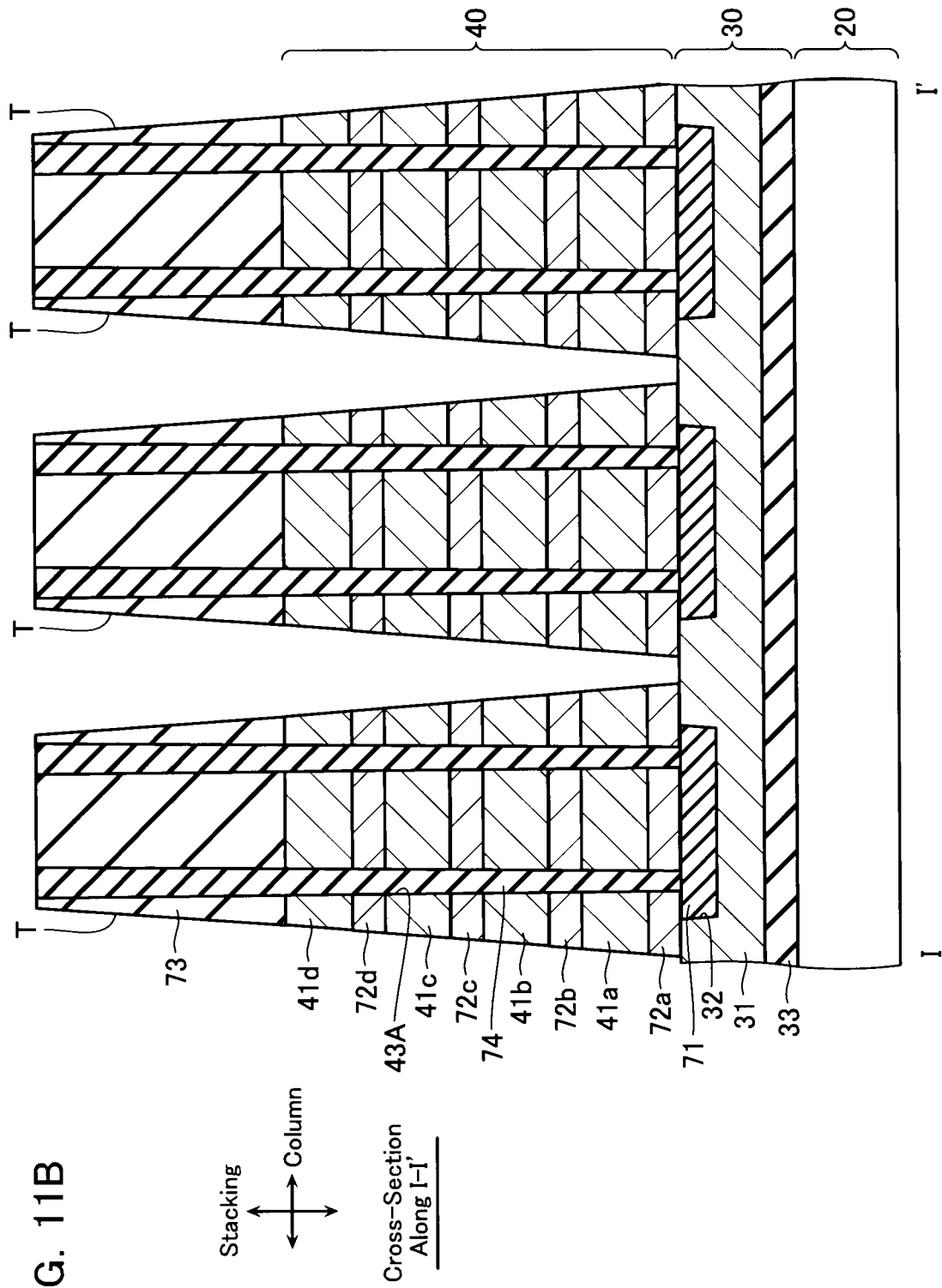

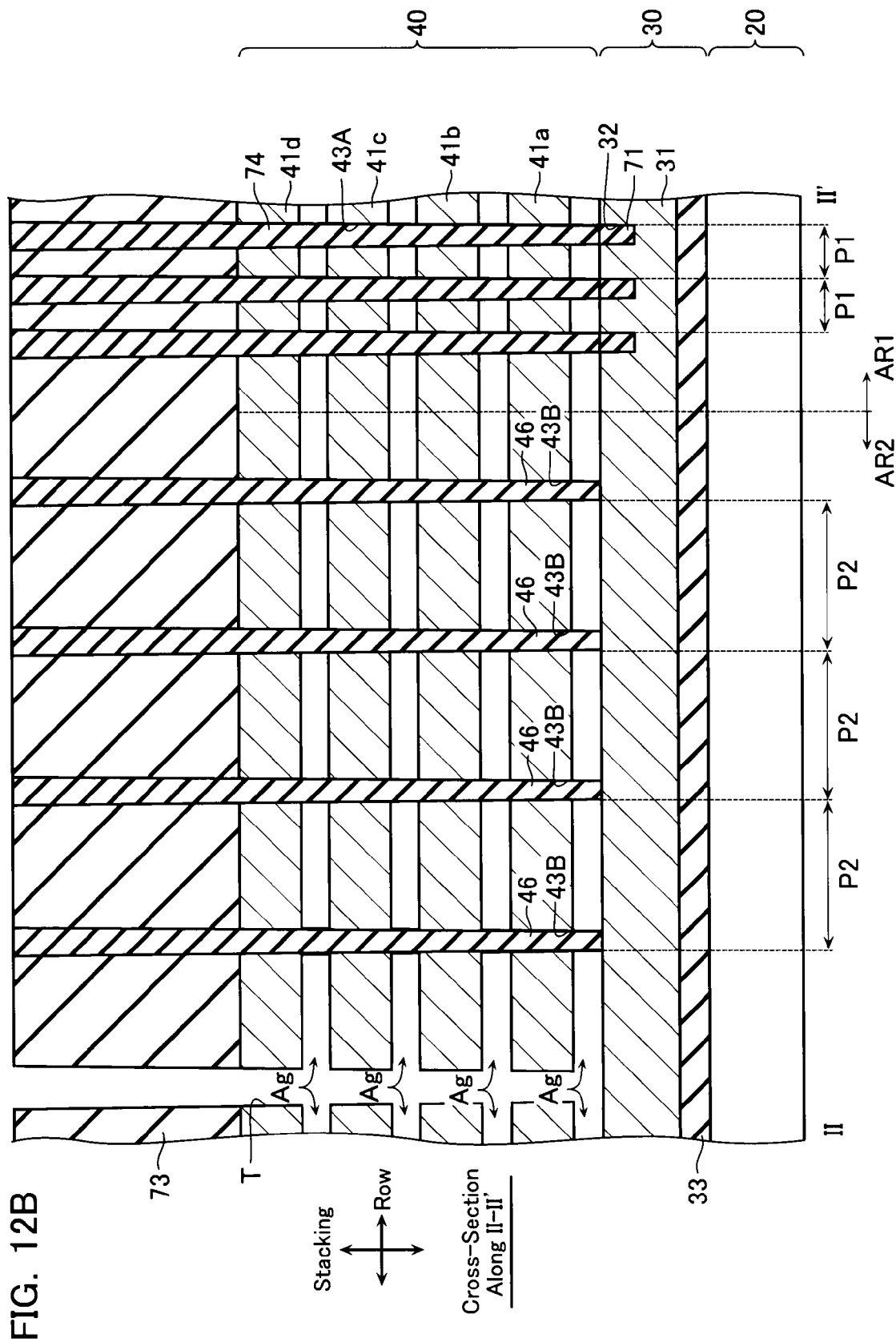

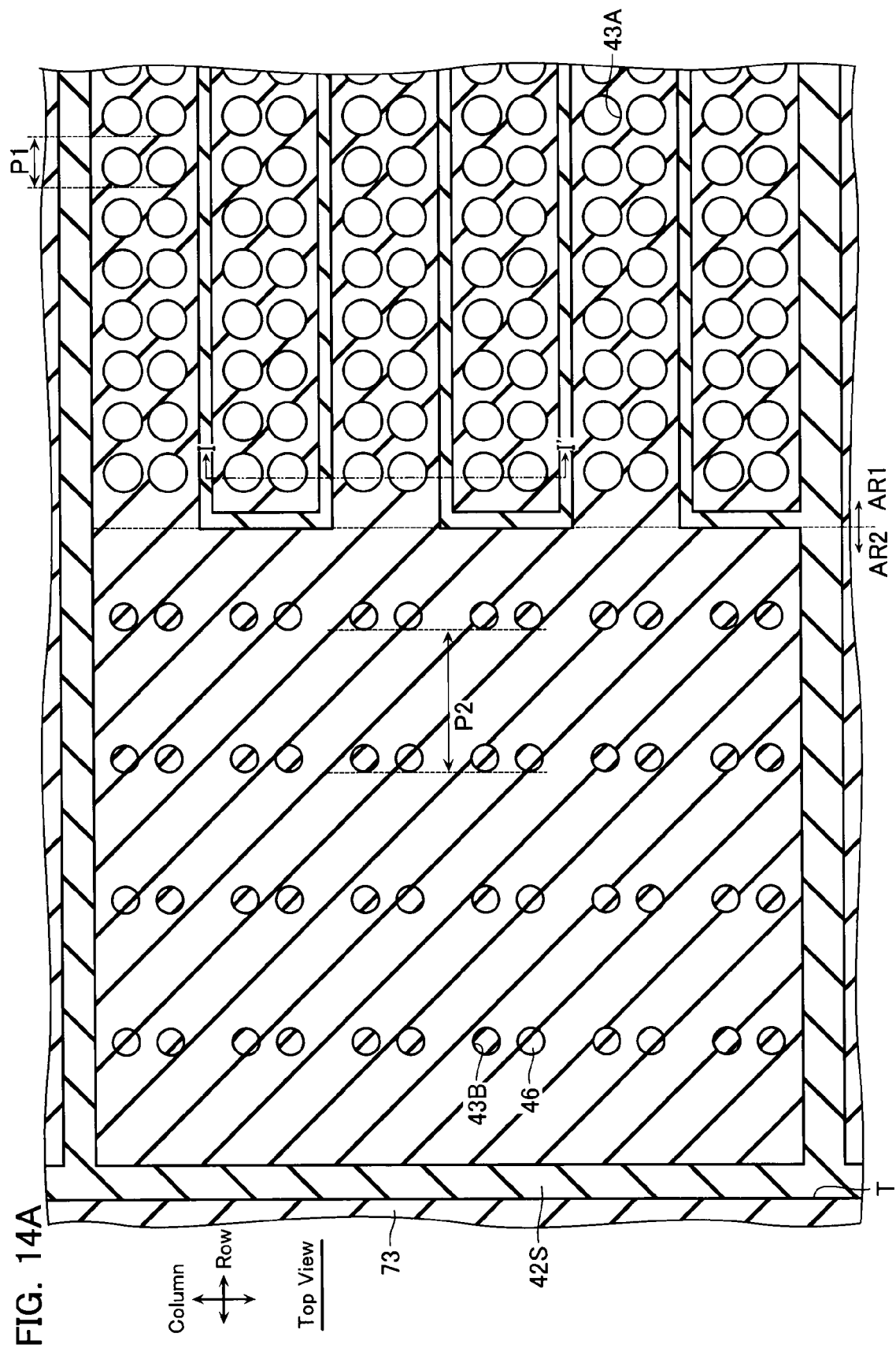

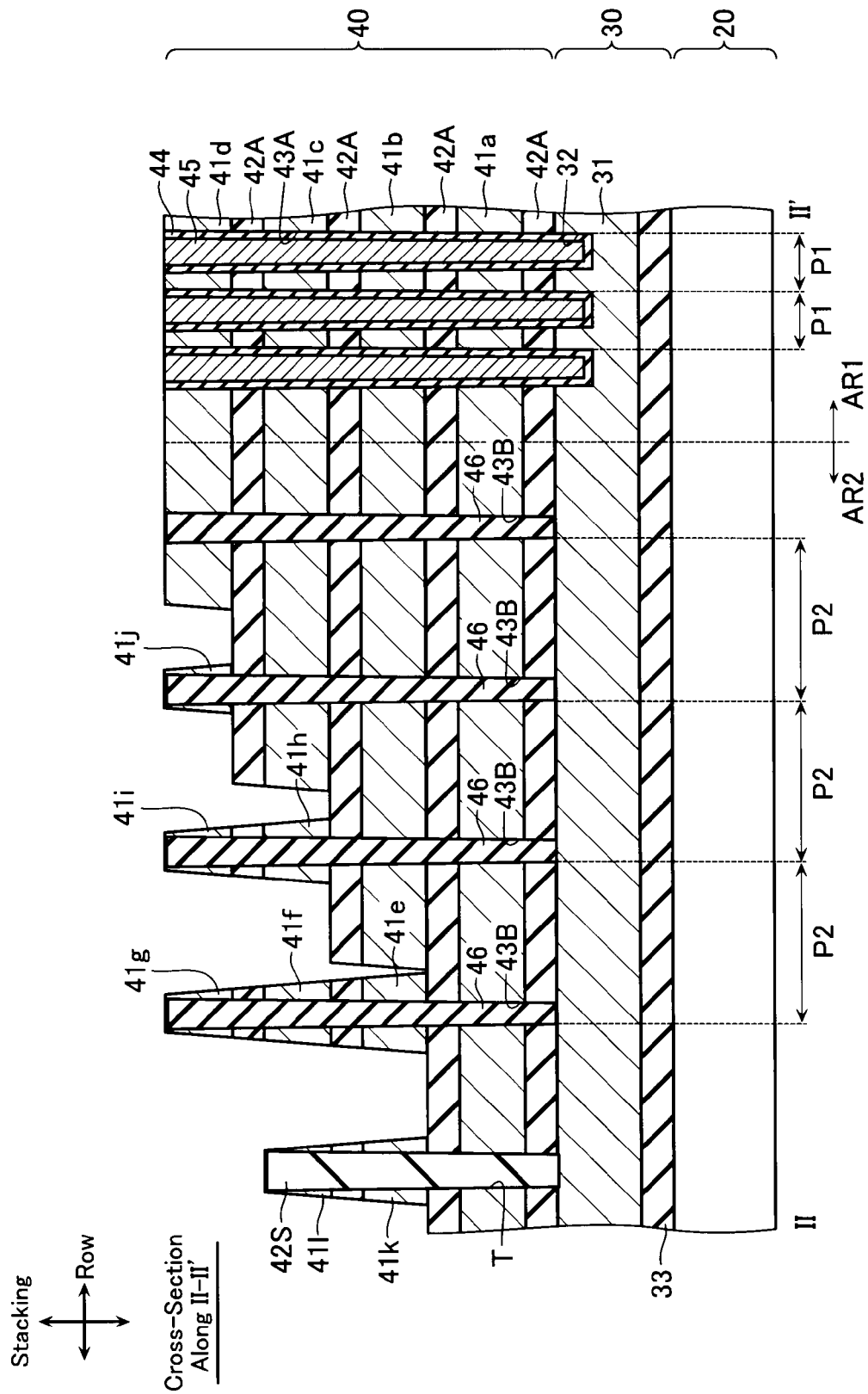

US 8,426,908 B2

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from the prior Japanese Patent Application No. 2009-206007, filed on Sep. 7, 2009, the entire contents of which are incorporated herein by reference.

FIELD

Embodiments described herein relates to a nonvolatile semiconductor memory device and a method of manufacturing the same.

BACKGROUND

In recent years, many semiconductor memory devices are proposed in which memory cells are disposed three-dimensionally to increase the degree of integration of memory.

For example, a nonvolatile semiconductor memory device includes a memory region having memory cells arranged therein, and a peripheral region positioned in the periphery of the memory region. Further, the structure of this nonvolatile semiconductor memory device includes a plurality of conductive layers (silicon (Si)) and insulating layers (silicon oxide (SiO$_2$)) stacked in the memory region and the peripheral region, and a column-shaped semiconductor layer (silicon (Si)) extending so as to penetrate these conductive layers and insulating layers. The conductive layers include a stepped portion formed in a stepped shape in a peripheral region thereof to allow contact with wiring in an upper layer. Moreover, in the memory region, the conductive layers function as control gates of the memory transistors (memory cells) and the semiconductor layer functions as a channel (body) of the memory transistors (memory cells).

However, since the above-described conductive layers and insulating layers have etching rates that differ greatly, it is difficult to form holes penetrating the conductive layers and insulating layers in one lot. Furthermore, there is a need to prevent faults from being generated in the stepped portion during manufacturing processes.

BRIEF DESCRIPTION OF THE DRAWINGS

FIG. 7A is a top view showing a manufacturing process of the nonvolatile semiconductor memory device 100 in accordance with the embodiment.

FIG. 8A is a top view showing a manufacturing process of the nonvolatile semiconductor memory device 100 in accordance with the embodiment.

FIG. 9B is a cross-sectional view taken along the line I-I' of FIG. 9A.

FIG. 9C is a cross-sectional view taken along the line II-II' of FIG. 9A.

FIG. 10B is a cross-sectional view taken along the line I-I' of FIG. 10A.

FIG. 10C is a cross-sectional view taken along the line II-II' of FIG. 10A.

FIG. 11B is a cross-sectional view taken along the line I-I' of FIG. 11A.

FIG. 12B is a cross-sectional view taken along the line II-II' of FIG. 11A.

FIG. 14A is a top view showing a manufacturing process of the nonvolatile semiconductor memory device 100 in accordance with the embodiment.

FIG. 16B is a cross-sectional view taken along the line II-II' of FIG. 16A.

DETAILED DESCRIPTION

According to one embodiment, a nonvolatile semiconductor memory device includes a first region having a plurality of electrically rewritable memory cells disposed therein, and a second region adjacent to the first region. The nonvolatile semiconductor memory device comprises a plurality of first conductive layers, a semiconductor layer, a charge storage layer, and an insulating columnar layer. The plurality of first conductive layers are stacked in the first region and the second region, and function as control electrodes of the memory cells in the first region. The plurality of first conductive layers include a stepped portion in the second region. Positions of ends of the plurality of first conductive layers are different in the stepped portion. The semiconductor layer is surrounded by the first conductive layers in the first region. The semiconductor layer includes a first columnar portion extending in a stacking direction, and functions as a body of the memory cells. The charge storage layer is formed between the first conductive layers and a side surface of the first columnar portion. The charge storage layer is configured to enable storage of a charge and thereby retain data of the memory cells. The insulating columnar layer is surrounded by the first conductive layers in the stepped portion. The insulating columnar layer includes a second columnar portion extending in the stacking direction and comprising an insulator.

An embodiment of a nonvolatile semiconductor memory device is described below with reference to the drawings.

[Configuration of Nonvolatile Semiconductor Memory Device 100 in accordance with Embodiment]

Figure 1:
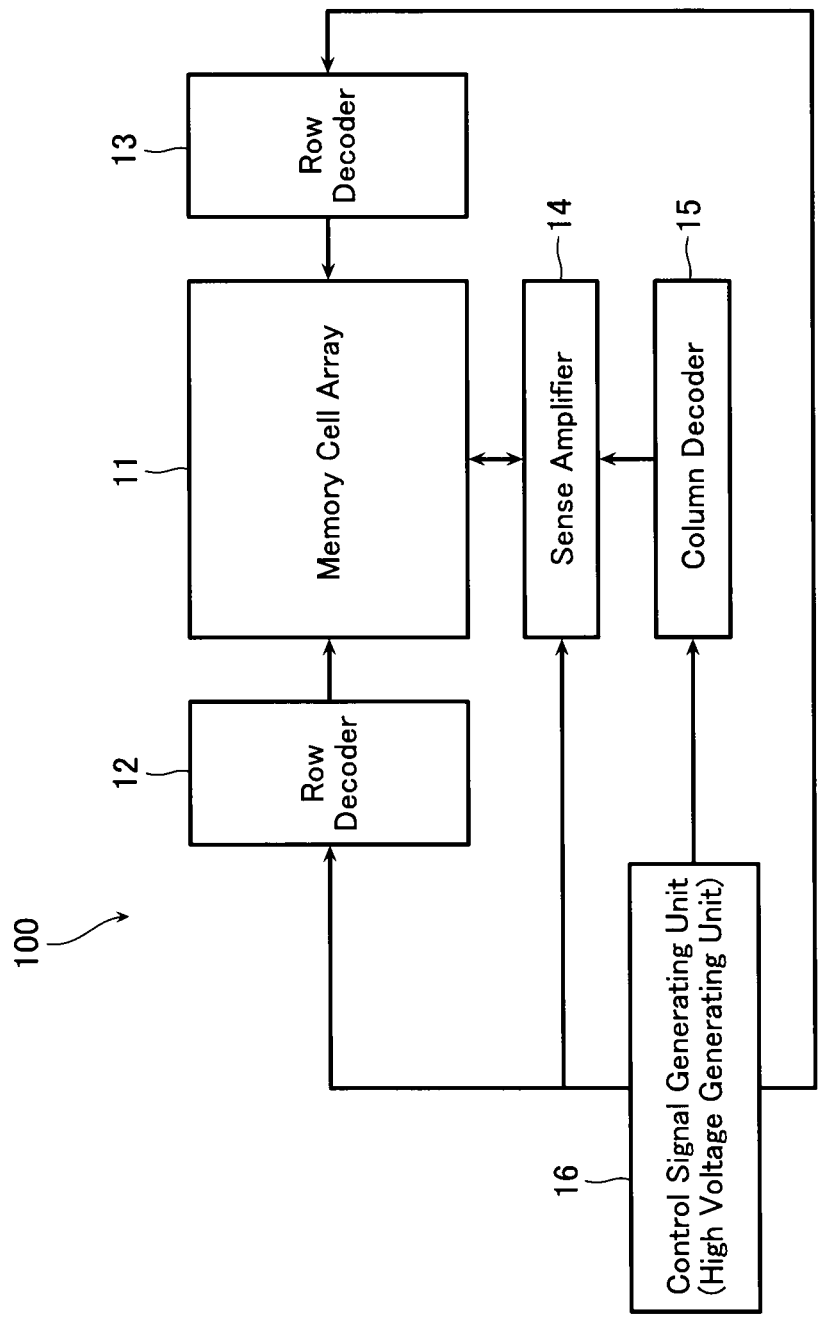
FIG. 1 is a block diagram of a nonvolatile semiconductor memory device 100 in accordance with an embodiment.

First, a configuration of a nonvolatile semiconductor memory device 100 in accordance with an embodiment is described with reference to FIGS. 1 and 2. FIG. 1 is a block diagram of the nonvolatile semiconductor memory device 100 in accordance with the embodiment of the present invention, and FIG. 2 is a schematic perspective view of the nonvolatile semiconductor memory device 100 in accordance with the embodiment of the present invention.

As shown in FIG. 1, the nonvolatile semiconductor memory device 100 in accordance with the embodiment comprises a memory cell array 11, row decoders 12 and 13, a sense amplifier 14, a column decoder 15, and a control signal generating unit (high voltage generating unit) 16.

Figure 2:
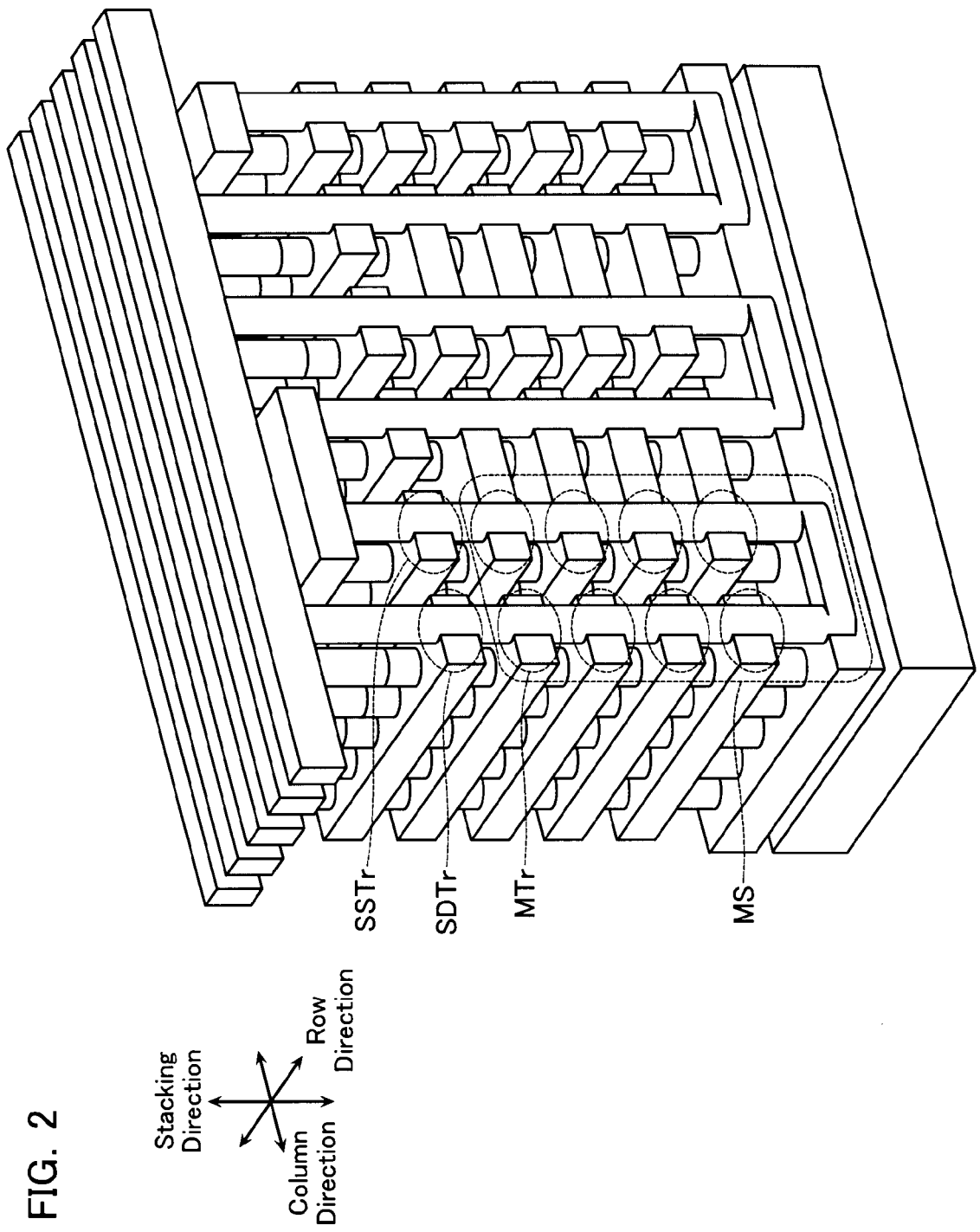
FIG. 2 is a schematic perspective view of the nonvolatile semiconductor memory device 100 in accordance with the embodiment.

As shown in FIG. 2, the memory cell array 11 is configured having electrically data-storing memory transistors MTr arranged in a three-dimensional matrix. That is, the memory transistors MTr, as well as being arranged in a matrix in a horizontal direction, are also arranged in a stacking direction. A plurality of the memory transistors MTr aligned in the stacking direction are connected in series to configure a widely known NAND string MS. Connected to the two ends of the NAND string MS are, respectively, a drain side select transistor SDTr and a source side select transistor, SSTr, which are rendered conductive when selected. The NAND string MS is arranged having the stacking direction as a long direction.

As shown in FIG. 1, the row decoders 12 and 13 decode a block address signal and so on downloaded thereto, and control the memory cell array 11. The sense amplifier 14 reads data from the memory cell array 11. The column decoder 15 decodes a column address signal and controls the sense amplifier 14. The control signal generating unit 16 boosts a reference voltage to generate a high voltage required during write and erase, and, further, generates a control signal to control the row decoders 12 and 13, the sense amplifier 14, and the column decoder 15.

Figure 3:
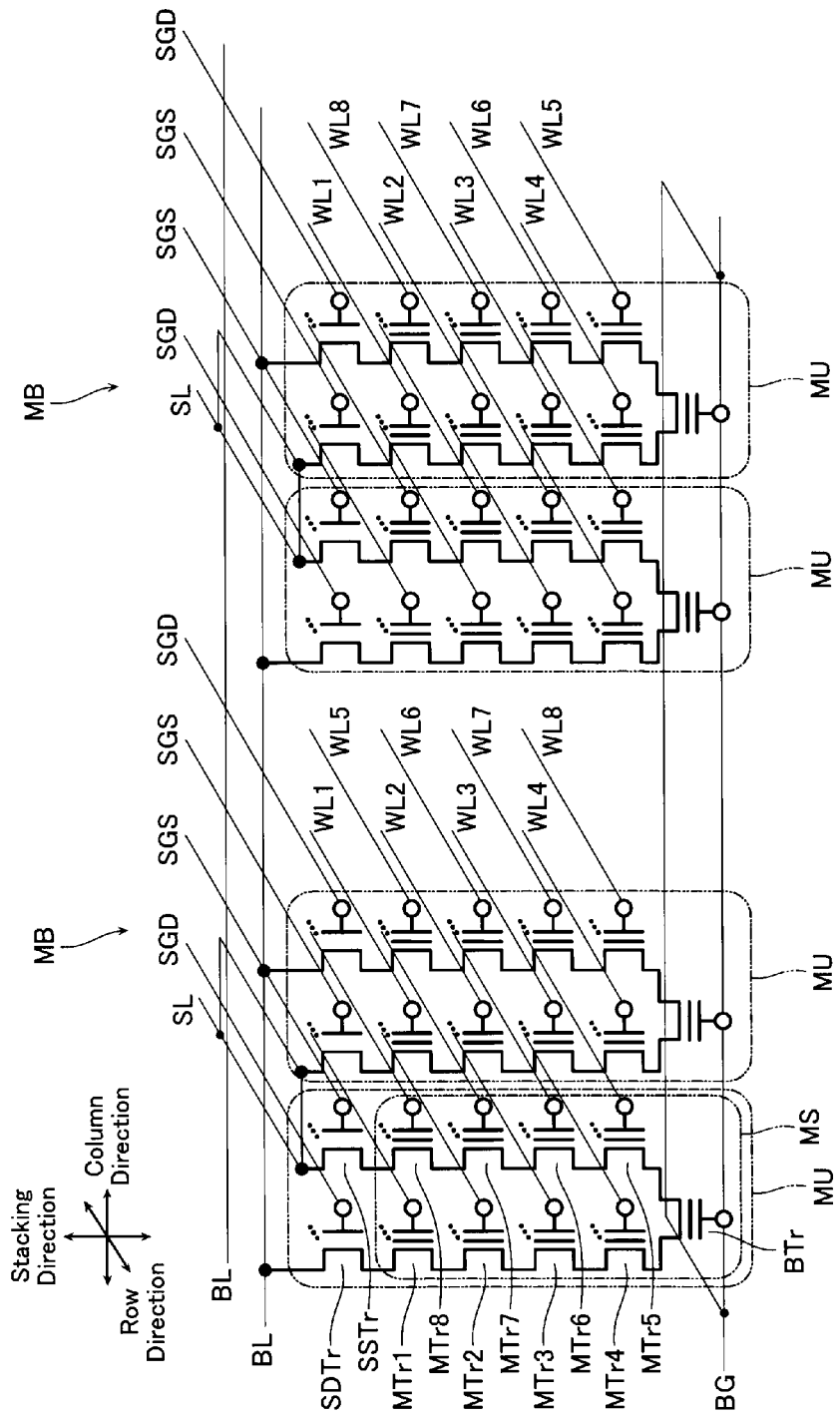
FIG. 3 is an equivalent circuit diagram of the nonvolatile semiconductor memory device 100 in accordance with the embodiment.

Next, a circuit configuration of the memory cell array 11 is described with reference to FIG. 3. FIG. 3 is an equivalent circuit diagram of the memory transistors MTr, the select transistors SDTr and SSTr, and a peripheral circuit thereof, formed along a cross-section in a column direction of the memory cell array 11.

As shown in FIG. 3, the memory cell array 11 includes a plurality of bit lines BL and a plurality of memory blocks MB. The bit lines BL are formed in stripes extending in the column direction and having a certain pitch in a row direction. The memory blocks MB are provided repeatedly in the column direction with a certain pitch.

As shown in FIG. 3, each of the memory blocks MB includes a plurality of memory units MU commonly connected to the bit lines BL. Each of the memory units MU includes the memory string MS, the source side select transistor SSTr, and the drain side select transistor SDTr. The memory units MU adjacent in the column direction are formed such that a configuration thereof is mutually symmetrical in the column direction. The memory units MU are arranged in a matrix in the row direction and the column direction.

The memory string MS is configured by memory transistors MTr1-MTr8 and a back gate transistor BTr connected in series. The memory transistors MTr1-MTr4 are connected in series in the stacking direction. The memory transistors MTr5-MTr8 also are similarly connected in series in the stacking direction. The memory transistors MTr1-MTr8 store data by trapping a charge in a charge storage layer. The back gate transistor BTr is connected between the lowermost layer memory transistors MTr4 and MTr5. The memory transistors MTr1-MTr8 and the back gate transistor BTr are thus connected in a U shape in a cross-section in the column direction. A source of the drain side select transistor SDTr is connected to one end of the memory string MS (a drain of the memory transistor MTr1). A drain of the source side select transistor SSTr is connected to the other end of the memory string MS (a source of the memory transistor MTr8).

Gates of the memory transistors MTr1 in the memory units MU arranged in a line in the row direction are commonly connected to a word line WL1 extending in the row direction. Similarly, gates of the memory transistors MTr2-MTr8 arranged in lines in the row direction are commonly connected to word lines WL2-WL8, respectively, extending in the row direction. Note that two memory strings MS adjacent in the column direction both share the word lines WL1-WL8. Moreover, gates of the back gate transistors BTr arranged in a matrix in the row direction and the column direction are commonly connected to a back gate line BG.

Gates of the drain side select transistors SDTr in the memory units MU arranged in a line in the row direction are commonly connected to a drain side select gate line SGD extending in the row direction. Moreover, drains of the drain side select transistors SDTr arranged in a line in the column direction are commonly connected to the bit line BL.

Gates of the source side select transistors SSTr in the memory units MU arranged in a line in the row direction are commonly connected to a source side select gate line SGS extending in the row direction. Moreover, in pairs of the memory units MU adjacent in the column direction, sources of the source side select transistors SSTr arranged in a line in the row direction are commonly connected to a source line SL extending in the row direction.

Figure 4A:
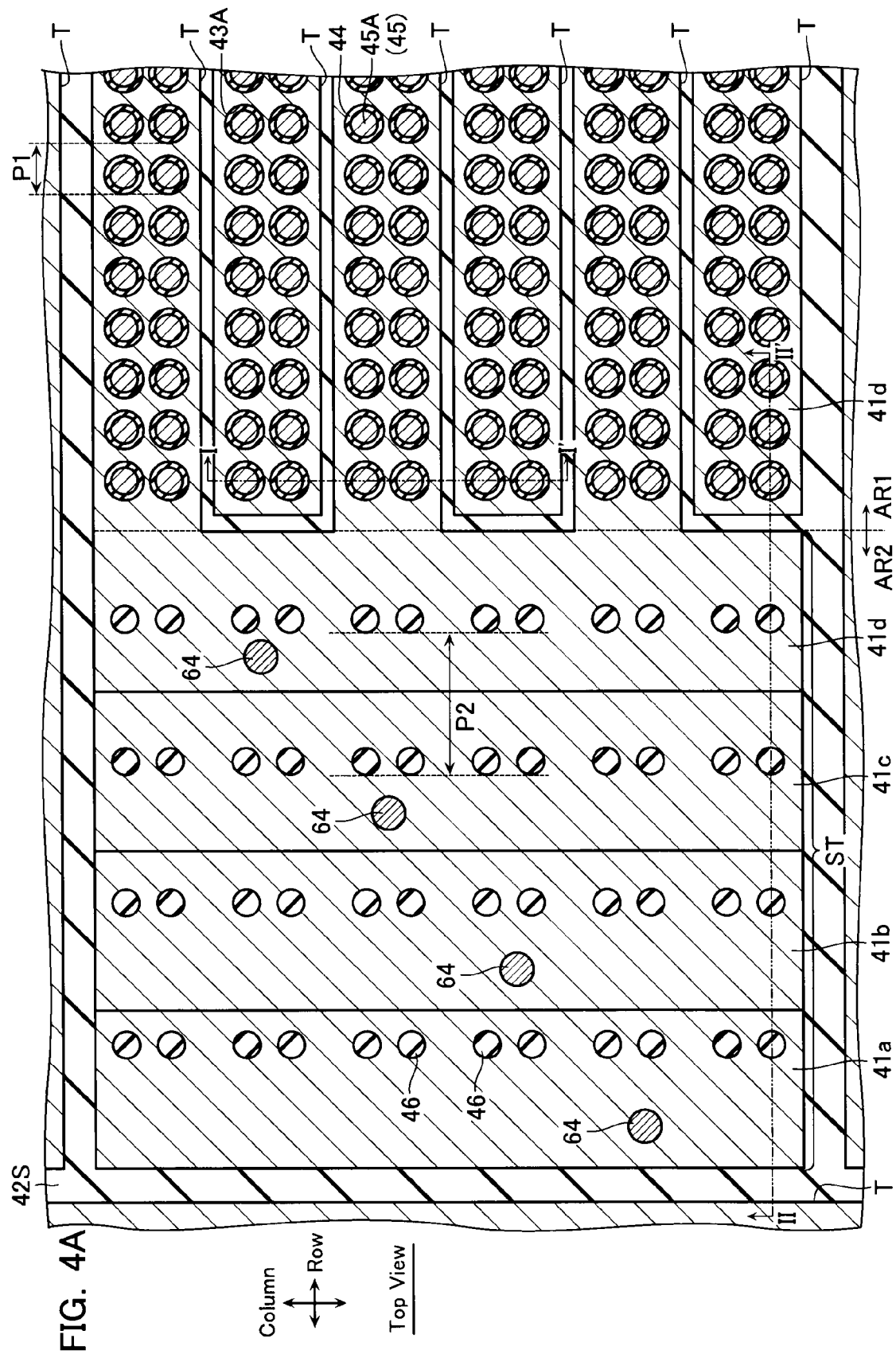
FIG. 4A is a schematic top view of the nonvolatile semiconductor memory device 100 in accordance with the embodiment.

Next, a stacking structure of the nonvolatile semiconductor memory device 100 in accordance with the embodiment configured to realize the circuit configuration shown in FIG. 3 is described with reference to FIGS. 4A-4C. FIG. 4A is a schematic top view of the nonvolatile semiconductor memory device 100 in accordance with the embodiment, FIG. 4B is a cross-sectional view taken along the line I-I' of FIG. 4A, and FIG. 4C is a cross-sectional view taken along the line II-II' of FIG. 4A.

As shown in FIG. 4A, the nonvolatile semiconductor memory device 100 includes a memory region AR1 having the memory transistors MTr1-MTr8 arranged therein, and a peripheral region AR2 provided in a periphery of the memory region AR1.

First, the memory region AR1 is described. As shown in FIG. 4B, the memory region AR1 of the nonvolatile semiconductor memory device 100 includes on a substrate 20, sequentially from a lower layer, a back gate layer 30, a memory transistor layer 40, a select transistor layer 50, and a wiring layer 60. The back gate transistor BTr is formed in the back gate layer 30. The memory transistors MTr1-MTr8 are formed in the memory transistor layer 40. The drain side select transistor SDTr and the source side select transistor SSTr are formed in the select transistor layer 50. The source line SL and the bit line BL are formed in the wiring layer 60.

Figure 4B:
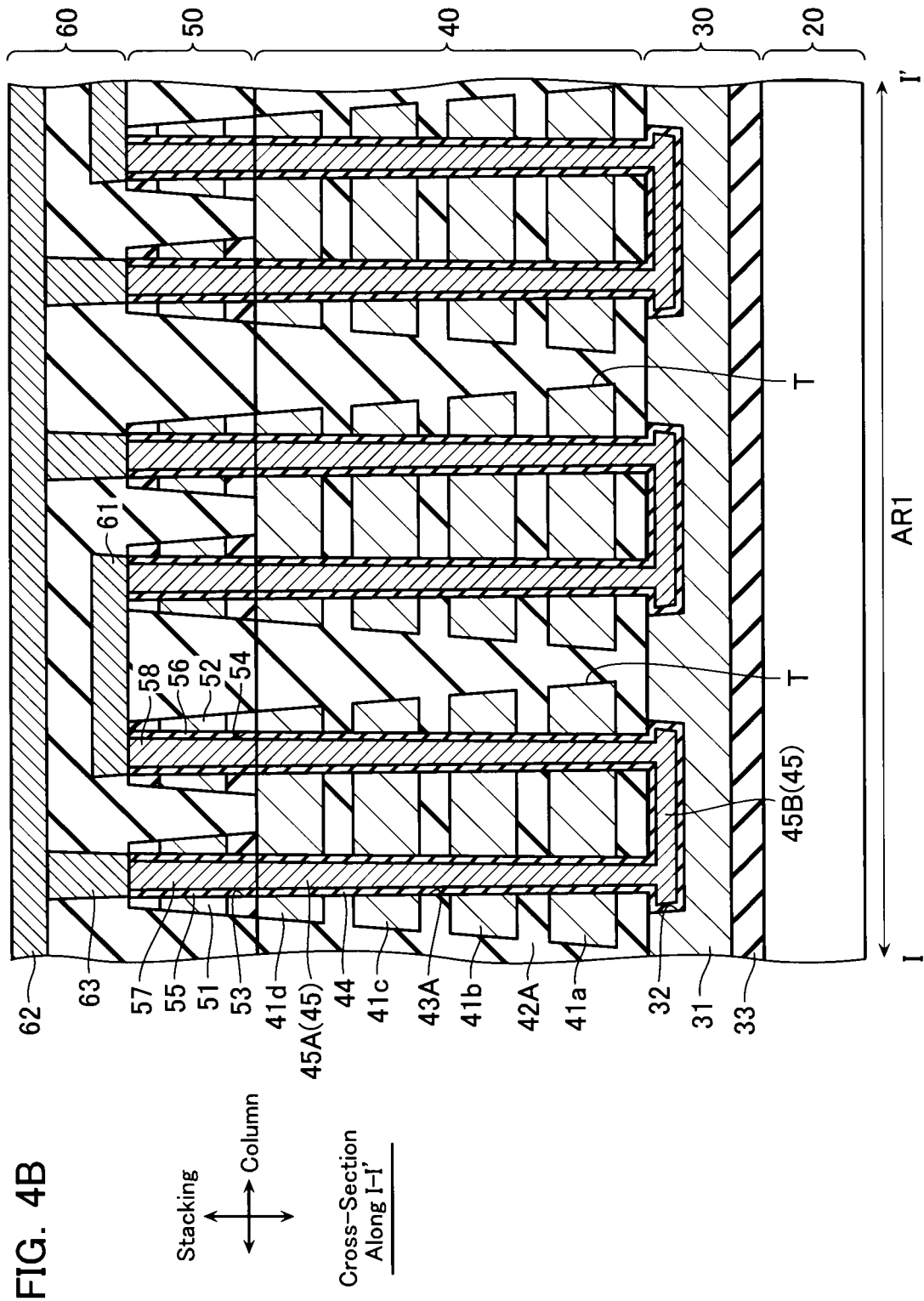
FIG. 4B is a cross-sectional view taken along the line I-I' of FIG. 4A.
Figure 4C:
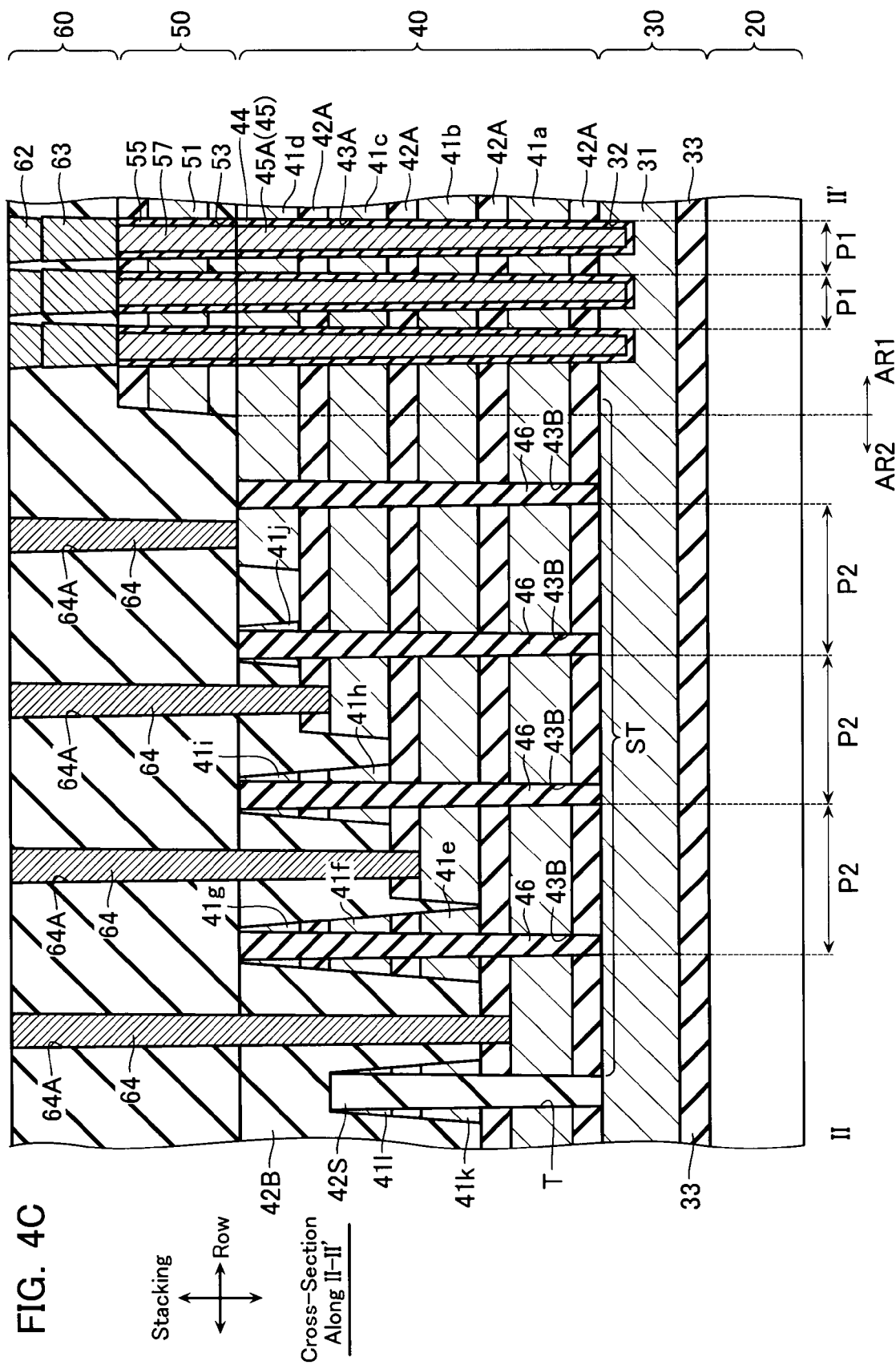
FIG. 4C is a cross-sectional view taken along the line II-II' of FIG. 4A.

The back gate layer 30 includes a back gate conductive layer 31 formed on the substrate 20 with an insulating layer 33 interposed therebetween, as shown in FIG. 4B. The back gate conductive layer 31 functions as the back gate line BG and as a gate of the back gate transistor BTr. The back gate conductive layer 31 is formed in a planar shape extending in the row direction and the column direction. The back gate conductive layer 31 covers a lower surface and a side surface of a joining portion 45B of a U-shaped semiconductor layer 45 to be described hereafter, and is formed to the same height as an upper surface of the joining portion 45B. The back gate conductive layer 31 is configured by polysilicon (poly-Si).

In addition, the back gate layer 30 includes a back gate hole 32 in the memory region AR1, the back gate hole 32 being formed so as to dig out the back gate conductive layer 31, as shown in FIG. 4B. The back gate hole 32 is configured as an opening having a short side in the row direction and a long side in the column direction. The back gate holes 32 are formed in a matrix at certain intervals in the row direction and the column direction.

The memory transistor layer 40 includes word line conductive layers 41a-41d and an insulating layer 42A in the memory region AR1, the word line conductive layers 41a-41d being stacked with a certain pitch in the stacking direction, as shown in FIG. 4B.

As shown in FIG. 4C, the word line conductive layers 41a-41d, as well as being stacked in the memory region AR1, are formed extending also into the peripheral region AR2, as described hereafter. The word line conductive layers 41a-41d function as the word lines WL1-WL8 and as gates of the memory transistors MTr1-MTr8. As shown in FIG. 4A, as viewed from above, the word line conductive layers 41a-41d are formed so as to be divided in a comb shape in the memory region AR1 by a trench T, the comb shape being configured alternately in the row direction. That is, the word line conductive layers 41a-41d are formed in stripes in the memory region AR1, the stripes extending in the row direction and having a certain pitch in the column direction. The word line conductive layers 41a-41d are configured by polysilicon (poly-Si). The trench T has a 90° rotated U-shape in a plan view. The trench T is formed in a tapered shape such that a diameter of the trench T becomes gradually smaller from an upper side to a lower side of the trench T as shown in FIG. 4B.

The insulating layer 42A is formed so as to fill between the word line conductive layers 41a-41d in the memory region AR1, as shown in FIG. 4B. The insulating layer 42A is configured by silicon oxide ($SiO_2$). The insulating layer 42A is formed as follows. During manufacture, a sacrifice layer is formed between the word line conductive layers 41a-41d, which sacrifice layer is removed to form an air gap, the air gap being filled in to form the insulating layer 42A.

Now, it is also possible to sequentially deposit the word line conductive layers 41a-41d and the insulating layer 42A, and then form a memory hole 43A penetrating these word line conductive layers 41a-41d and insulating layer 42A. However, due to a difference in etching rates of the word line conductive layers 41a-41d and insulating layer 42A, it is difficult to form the memory hole 43A having a desired shape. Thus, in the present embodiment, first, the word line conductive layers 41a-41d and the sacrifice layer are alternately deposited and the memory hole 43A formed. Subsequently, a semiconductor layer is formed in the memory hole 43A. Then, the sacrifice layer is removed and an air gap formed in the removed portion, the insulating layer 42A being formed in the air gap. A detailed method of manufacturing is described hereafter.

In addition, the memory transistor layer 40 includes the memory hole 43A in the memory region AR1, the memory hole 43A being formed penetrating the word line conductive layers 41a-41d and the insulating layer 42A, as shown in FIG. 4B.

The memory hole 43A is formed so as to be aligned with a position of the two end vicinities in the column direction of each back gate hole 32, as shown in FIG. 4B. Moreover, the memory holes 43A are formed in a matrix having a first pitch P1 in the row direction and a certain pitch in the column direction.

In addition, the above-described back gate transistor layer 30 and memory transistor layer 40 include a memory gate insulating layer 44 and the U-shaped semiconductor layer 45 in the memory layer AR1, as shown in FIG. 4B. The U-shaped semiconductor layer functions as a body of the memory transistors MTr1-MTr8.

Figure 5A:
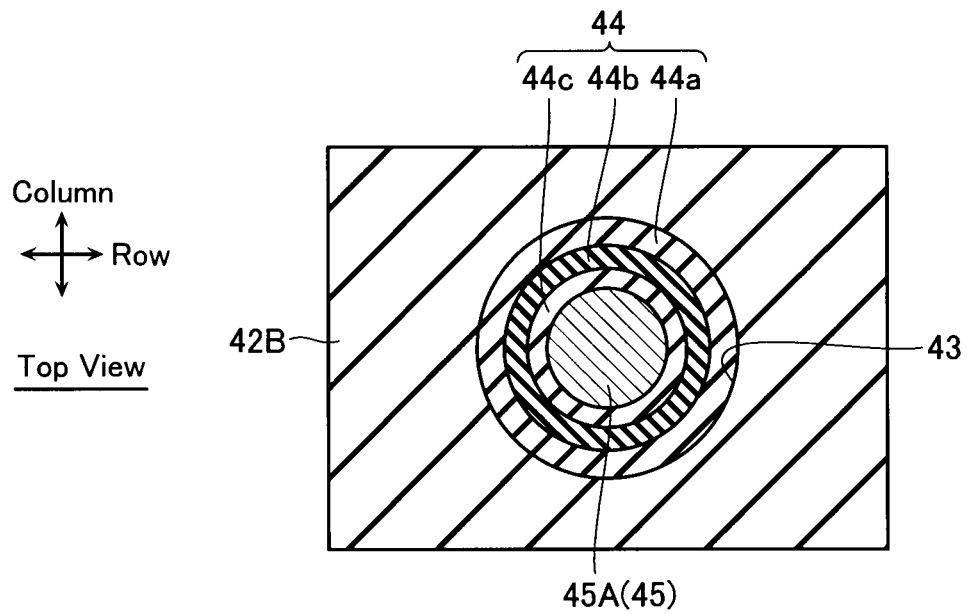
FIG. 5A is an enlarged view of FIG. 4A.
Figure 5B:
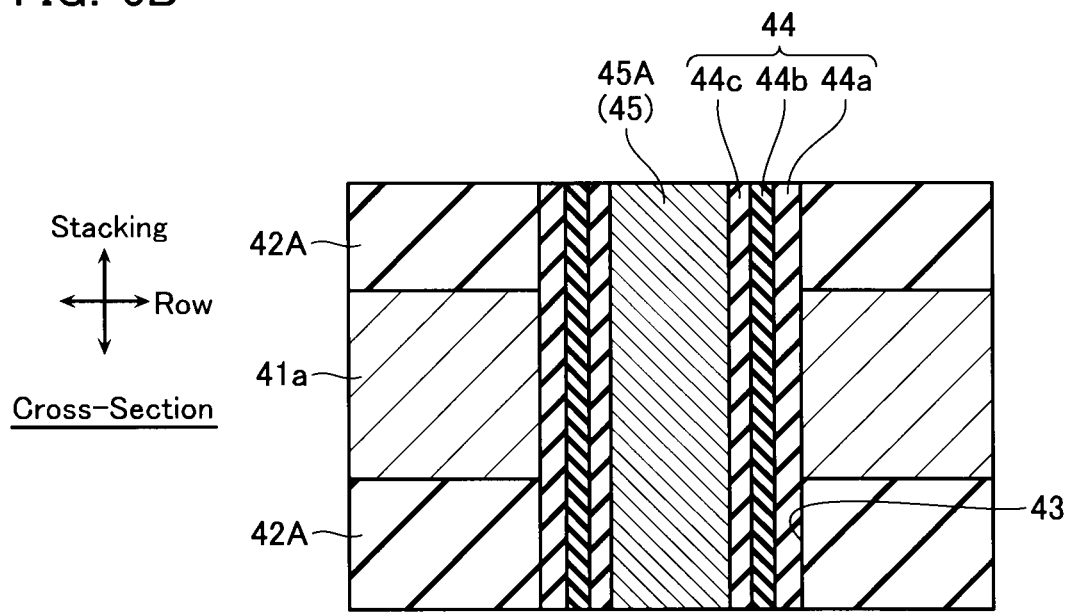
FIG. 5B is an enlarged view of FIG. 4B.

The memory gate insulating layer 44 is formed on a side surface of the memory hole 43A and the back gate hole 32, as shown in FIG. 4B. The memory gate insulating layer 44 is configured by a block insulating layer 44a, a charge storage layer 44b, and a tunnel insulating layer 44c, as shown in FIGS. 5A and 5B. The block insulating layer 44a is formed along the side surface of the memory hole 43A and the back gate hole 32 so as to be in contact with the word line conductive layers 41a-41d and the back gate conductive layer 31. The block insulating layer 44a is configured by silicon oxide ($SiO_2$). The charge storage layer 44b is formed on a side surface of the block insulating layer 44a. The charge storage layer 44b is used to store a charge, thereby retaining data of the memory transistors MTr1-MTr8. The charge storage layer 44b is configured by silicon nitride (SiN). The tunnel insulating layer 44c is formed along a side surface of the charge storage layer 44b so as to be in contact with the U-shaped semiconductor layer 45. The tunnel insulating layer 44c is configured by silicon oxide ($SiO_2$).

The U-shaped semiconductor layer 45 is formed in a U shape as viewed from the row direction, as shown in FIG. 4B. The U-shaped semiconductor layer 45 is formed so as to be in contact with the tunnel insulating layer 44c and so as to fill the back gate hole 32 and the memory hole 43A, as shown in FIGS. 5A and 5B. That is, the U-shaped semiconductor layers 45 are formed in a matrix having the first pitch P1 in the row direction and a certain pitch in the column direction. The U-shaped semiconductor layer 45 includes a pair of columnar portions 45A extending in a perpendicular direction with respect to the substrate 20 as viewed from the row direction, and the joining portion 45B formed so as to join lower ends of the pair of columnar portions 45A. The U-shaped semiconductor layer 45 is configured by polysilicon (poly-Si).

Expressing the above-described configuration of the memory transistor layer 40 in other words, the tunnel insulating layer 44c is formed so as to surround a side surface of the columnar portion 45A. The charge storage layer 44b is formed so as to surround a side surface of the tunnel insulating layer 44c. The block insulating layer 44a is formed so as to surround a side surface of the charge storage layer 44b. The word line conductive layers 41a-41d are formed so as to surround a side surface of the block insulating layer 44a.

The select transistor layer 50 includes a drain side conductive layer 51 and a source side conductive layer 52, the source side conductive layer 52 being formed in the same layer as the drain side conductive layer 51, as shown in FIG. 4B. The drain side conductive layer 51 functions as the drain side select gate line SGD and as a gate of the drain side select transistor SDTr. The source side conductive layer 52 functions as the source side select gate line SGS and as a gate of the source side select transistor SSTr.

The drain side conductive layer 51 and the source side conductive layer 52 are formed in the memory region AR1, as shown in FIG. 4B. The drain side conductive layer 51 and the source side conductive layer 52 are formed in stripes extending in the row direction and having a certain pitch in the column direction. The drain side conductive layer 51 and the source side conductive layer 52 are formed in the same layer and provided alternately two at a time in the column direction. The drain side conductive layer 51 and the source side conductive layer 52 are configured by polysilicon (poly-Si).

In addition, the select transistor layer 50 includes a drain side hole 53 and a source side hole 54, as shown in FIG. 4B. The drain side hole 53 is formed penetrating the drain side conductive layer 51. The source side hole 54 is formed penetrating the source side conductive layer 52. The drain side hole 53 and the source side hole 54 are formed at a position aligning with the memory hole 43A.

Moreover, the select transistor layer 50 includes a drain side gate insulating layer 55, a source side gate insulating layer 56, a drain side columnar semiconductor layer 57, and a source side columnar semiconductor layer 58. The drain side columnar semiconductor layer 57 functions as a body of the drain side select transistor SDTr. The source side columnar semiconductor layer 58 functions as a body of the source side select transistor SSTr.

The drain side gate insulating layer 55 is formed on a side surface of the drain side hole 53. The source side gate insulating layer 56 is formed on a side surface of the source side hole 54. The drain side gate insulating layer 55 and the source side gate insulating layer 56 are configured by silicon oxide ($SiO_2$). The drain side columnar semiconductor layer 57 is formed in a column (pillar) shape extending in the stacking direction and in contact with the drain side gate insulating layer 55, and so as to fill the drain side hole 53. The drain side columnar semiconductor layer 57 is formed such that its lower surface is in contact with an upper surface of the columnar portion 45A of the U-shaped semiconductor layer 45. The source side columnar semiconductor layer 58 is formed in a column shape extending in the stacking direction and in contact with the source side gate insulating layer 56, and so as to fill the source side hole 54. The source side columnar semiconductor layer 58 is formed such that its lower surface is in contact with an upper surface of the columnar portion 45A of the U-shaped semiconductor layer 45. The drain side columnar semiconductor layer 57 and the source side columnar semiconductor layer 58 are configured by polysilicon (poly-Si).

Expressing the above-described configuration of the select transistor layer 50 in other words, the drain side gate insulating layer 55 is formed so as to surround a side surface of the drain side columnar semiconductor layer 57. The drain side conductive layer 51 is formed so as to surround a side surface of the drain side gate insulating layer 55. The source side gate insulating layer 56 is formed so as to surround a side surface of the source side columnar semiconductor layer 58. The source side conductive layer 52 is formed so as to surround a side surface of the source side gate insulating layer 56.

The wiring layer 60 includes a first wiring layer 61, a second wiring layer 62, and a plug layer 63, as shown in FIG. 4B. The first wiring layer 61 functions as the source line SL. The second wiring layer 62 functions as the bit line BL.

The first wiring layer 61 is formed so as to be commonly in contact with upper surfaces of adjacent two of the source side columnar semiconductor layers 58, as shown in FIG. 4B. The first wiring layer 61 is formed in stripes extending in the row direction and having a certain pitch in the column direction. The first wiring layer 61 is configured by a metal such as tungsten (W).

The second wiring layer 62 is connected via the plug layer 63 to an upper surface of the drain side columnar semiconductor layer 57, as shown in FIG. 4B. The second wiring layer 62 is formed in stripes extending in the column direction and having a certain pitch in the row direction. The second wiring layer 62 and the plug layer 63 are configured by a metal such as tungsten (W).

Next, the peripheral region AR2 is described. As shown in FIG. 4C, the peripheral region AR2 of the nonvolatile semiconductor memory device 100 in accordance with the embodiment includes the word line conductive layers 41a-41d and the insulating layer 42A extending from the memory region AR1, and an insulating layer 42B formed so as to fill these word line conductive layers 41a-41d and insulating layer 42A.

The word line conductive layers 41a-41d in the peripheral region AR2 are formed in a plate shape extending in the row direction and the column direction, and include a stepped portion ST, as shown in FIG. 4C. The stepped portion ST is formed in a stepped shape such that positions of ends of the word line conductive layers 41a-41d differ, thereby enabling connection of a contact plug layer 64 to be described hereafter.

The insulating layer 42A is formed by removing a sacrifice layer to form an air gap between the word line conductive layers 41a-41d and then filling the air gap with an insulator, similarly to the memory region AR1, as shown in FIG. 4C.

The insulating layer 42B is formed in the peripheral region AR2 so as to planarize the stepped portion ST, as shown in FIG. 4C. The insulating layer 42B is configured by silicon oxide ($SiO_2$).

Now, the stacking structure in accordance with the above-described embodiment may be formed by the following manufacturing processes. That is, first, the word line conductive layers 41a-41d and the sacrifice layer are stacked alternately. Then, the memory hole 43A is formed penetrating the word line conductive layers 41a-41d, and the U-shaped semiconductor layer 45 formed in the memory hole 43A with the memory gate insulating layer 44 sandwiched therebetween. Next, the sacrifice layer is removed to form the air gap between the word line conductive layers 41a-41d. Then, the insulating layer 42A is formed so as to fill the air gap.

Even in the above-described case where the air gap is formed by removing the sacrifice layer, the word line conductive layers 41a-41d in the memory region AR1 are supported by many U-shaped semiconductor layers 45 and thus maintain a fixed shape without sagging under their own weight. In contrast, the word line conductive layers 41a-41d in the peripheral region AR2 do not have a support structure of the likes of the U-shaped semiconductor layer 45. Therefore, when the air gap is formed, the word line conductive layers 41a-41d in the peripheral region AR2 sag under their own weight. As a result, there may be a risk that, in the peripheral region AR2 (stepped portion ST), the sagging word line conductive layers 41a-41d make contact with each other, thereby causing a short circuit between them.

To solve the above-described problem, the nonvolatile semiconductor memory device in accordance with the present embodiment includes a columnar layer (insulating columnar layer) in the stepped portion ST of the peripheral region AR2, the columnar layer 46 being formed so as to penetrate the word line conductive layers 41a-41d, as shown in FIG. 4C. The columnar layer 46 is formed prior to the air gap being formed by removing the sacrifice layer. Accordingly, the columnar layer 46 becomes a structure for supporting the word line conductive layers 41a-41d when the air gap is formed in the peripheral region AR2, and thereby prevents sagging and suppresses a defect (short circuit) occurring in the stepped portion ST.

The columnar layer 46 is formed in a column shape extending in the perpendicular direction so as to fill a dummy hole 43B penetrating the word line conductive layers 41a-41d and the insulating layer 42B, as shown in FIG. 4C. The columnar layers 46 are formed in a matrix having a second pitch P2 in the row direction and a certain pitch in the column direction, the second pitch P2 being greater than the first pitch P1 (P2>P1). The columnar layer 46 is formed in a tapered shape such that a diameter of the columnar layer 46 becomes gradually smaller from an upper side to a lower side of the columnar layer 46. The columnar layer 46 is configured by an insulator, for example, silicon nitride (SiN). The columnar layer 46 is shorter in the stacking direction than the columnar portion 45A.

In addition, the stepped portion ST is formed by etching each of the word line conductive layers 41a-41d and insulating layer 42A, while gradually slimming a resist, as mentioned hereafter. When forming the stepped portion ST, since the columnar layer 46 is formed in a tapered shape, conductive layers 41e-41j which are etching residues of the word line conductive layers 41a-41d get formed in a periphery of the columnar layer 46, as shown in FIG. 4C. That is, the conductive layers 41e-41j, which are a portion of the word line conductive layers 41a-41d, are left remaining in the region shaded, during etching, by the columnar layer 46. The conductive layers 41e-41j are positioned on an upper surface of each of the steps of the stepped portion ST.

Moreover, the trench T for sacrifice layer removal is formed at an outer periphery of the word line conductive layers 41a-41d, and a tapered insulating layer 42S (wall insulating layer) exists in this trench T during formation of the stepped portion ST. As a result, conductive layers 41k and 41l which are etching residues of the word line conductive layers 41a-41d get formed along the insulating layer 42S, as shown in FIG. 4C. That is, the conductive layers 41k and 41l, which area portion of the word line conductive layers 41a-41d, are left remaining in the region shaded, during etching, by the insulating layer 42S. Since the insulating layer 42S is formed as a wall surrounding a periphery of the word line conductive layers 41a-41d, the conductive layers 41k and 41l are also formed surrounding the word line conductive layers 41a-41d. In addition, the conductive layers 41k and 41l are formed surrounding the insulating layer 42S. The insulating layer 42S is configured by silicon oxide ($SiO_2$). In forming the stepped portion ST, while the insulating layer 42S ($SiO_2$) is etched with the insulating layer 42A ($SiO_2$), the columnar layer 46 (SiN) is not etched by the etching selectivity. Thereby, the columnar layer 46 is higher in the stacking direction than the insulating layer 42S in the peripheral region AR2.

The conductive layers 41e-41l are formed through the above-mentioned manufacturing processes. The conductive layers 41e-41l are therefore configured by the same material as the word line conductive layers 41a-41d, for example, polysilicon (poly-Si). Each of the conductive layers 41e-41l is formed in the same layer as one of the word line conductive layers 41a-41d. Further, several of the conductive layers 41e-41l are formed in close proximity to the word line conductive layers 41a-41d in the same layer, and in some cases short electrically with the word line conductive layers 41a-41d in the same layer.

As an example, the conductive layer 41e in FIG. 4C is formed in the same layer as the word line conductive layer 41b and shorts with the word line conductive layer 41b. In addition, the conductive layer 41k shorts with the word line conductive layer 41b (not shown). The other conductive layers 41f-41j and 41l are sufficiently separated from the word line conductive layers 41a-41d and do not short. This is merely an example, and the positional relationship between the conductive layers 41e-41l and the word line conductive layers 41a-41d is not limited to that shown in FIG. 4C.

In addition, the nonvolatile semiconductor memory device in accordance with the embodiment includes a contact plug layer 64 in the peripheral region AR2, the contact plug layer 64 being electrically connected to the wiring in an upper layer (not shown) and to the word line conductive layers 41a-41d, as shown in FIG. 4C.

The contact plug layer 64 is formed in a column shape extending in the stacking direction and such that a lower surface of the contact plug layer 64 is in contact with an upper surface of the word line conductive layers 41a-41d in the stepped region ST. The contact plug layer 64 is formed in a tapered shape such that a diameter of the contact plug layer 64 becomes gradually smaller from an upper side to a lower side of the contact plug layer 64. The contact plug layer 64 is formed within a contact hole 64A which penetrates an insulating layer covering an upper portion of the stepped portion ST. The contact plug layer 64 is configured by a metal, such as tungsten (W).

Next, process for forming the contact plug layer 64 are described. The contact plug layer 64 is formed separated from the conductive layers 41e-41l shorted with any of the word line conductive layers 41a-41d. As a result, no short circuit with the word line conductive layers 41a-41d arises due to the contact plug layer 64 and the conductive layers 41e-41l. As an example, the contact plug layer 64 in FIG. 4C is formed separated from the conductive layer 41e shorted with the word line conductive layer 41b. Moreover, the contact plug layer 64 is formed separated from the conductive layer 41k shorted with the word line conductive layer 41b. Note that in the example shown in FIG. 4C, the contact plug layer 64 may be formed in contact with the conductive layer 41h which is not shorted with the word line conductive layer 41c, and, further, may be formed in contact with the conductive layer 41j which is not shorted with the word line conductive layer 41d.

Figure 6:
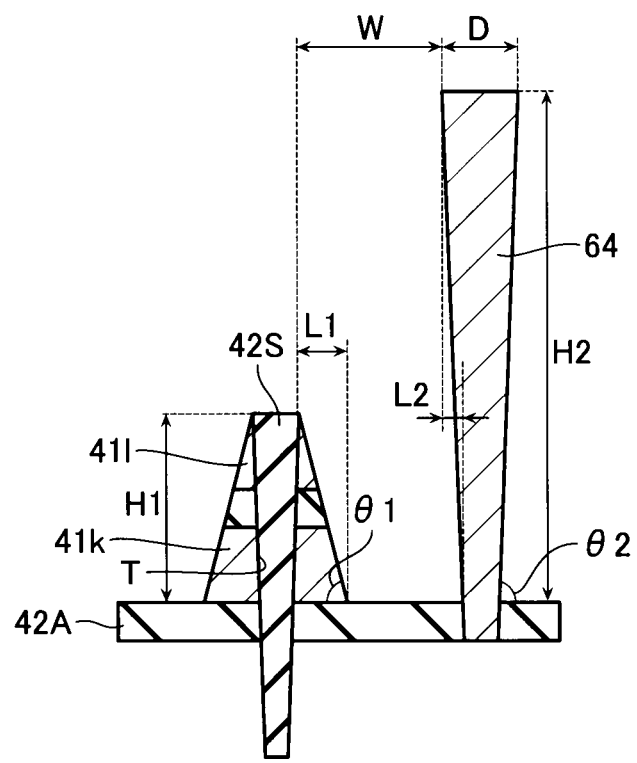
FIG. 6 is a view showing a relationship between a trench T and a contact plug layer 64.

FIG. 6 shows a relationship between the trench T and the contact plug layer 64. As shown in FIG. 6, the conductive layers 41k and 41l are assumed to be formed in a tapered shape having an inclination of a first angle θ1 (approximate value), and the conductive layer 41k and conductive layer 41l in combination assumed to be formed having a first height H1. The contact plug layer 64 is assumed to be formed in a tapered shape having an inclination of a second angle θ2 (approximate value), and the contact plug layer 64 is assumed to be formed having a second height H2 from a lower surface of the conductive layer 41*k*. Moreover, a diameter of the contact plug layer 64 is assumed to be of a diameter D.

Furthermore, a distance in a horizontal direction between an upper end of the contact plug layer 64 and an end of the conductive layer 41*l* facing the trench T is assumed to be a distance W. Moreover, a distance in the horizontal direction between an upper end of the trench T and a lower end of the conductive layer 41*k* is assumed to be a distance L1. In addition, a difference between a radius of the contact plug layer 64 at the upper end of the contact plug layer 64 and a radius of the contact plug layer 64 at an upper surface of the insulating layer 42A where it is penetrated by the contact plug layer 64 is assumed to be a distance L2.

In the above-described case shown in FIG. 6, the contact plug layer 64 is formed satisfying the positional relationship of expressions 1-3 shown below. Note that a positional relationship between the contact plug layer 64 and the conductive layer 41*l* is also similar. A short circuit between the contact plug layer and the conductive layers 41*k* and 41*l* is thereby prevented.

$$W > L1 - L2 \quad \text{(expression 1)}$$

$$L1 = H1/\tan\theta1 \quad \text{(expression 2)}$$

$$L2 = H2/\tan\theta2 \quad \text{(expression 3)}$$

[Method of Manufacturing Nonvolatile Semiconductor Memory Device 100 in Accordance with Embodiment]

Next, a method of manufacturing the nonvolatile semiconductor memory device in accordance with the embodiment is described with reference to FIGS. 7A-16B. FIGS. 7A-16B are views showing manufacturing processes of the nonvolatile semiconductor memory device 100 in accordance with the embodiment.

Figure 7B:
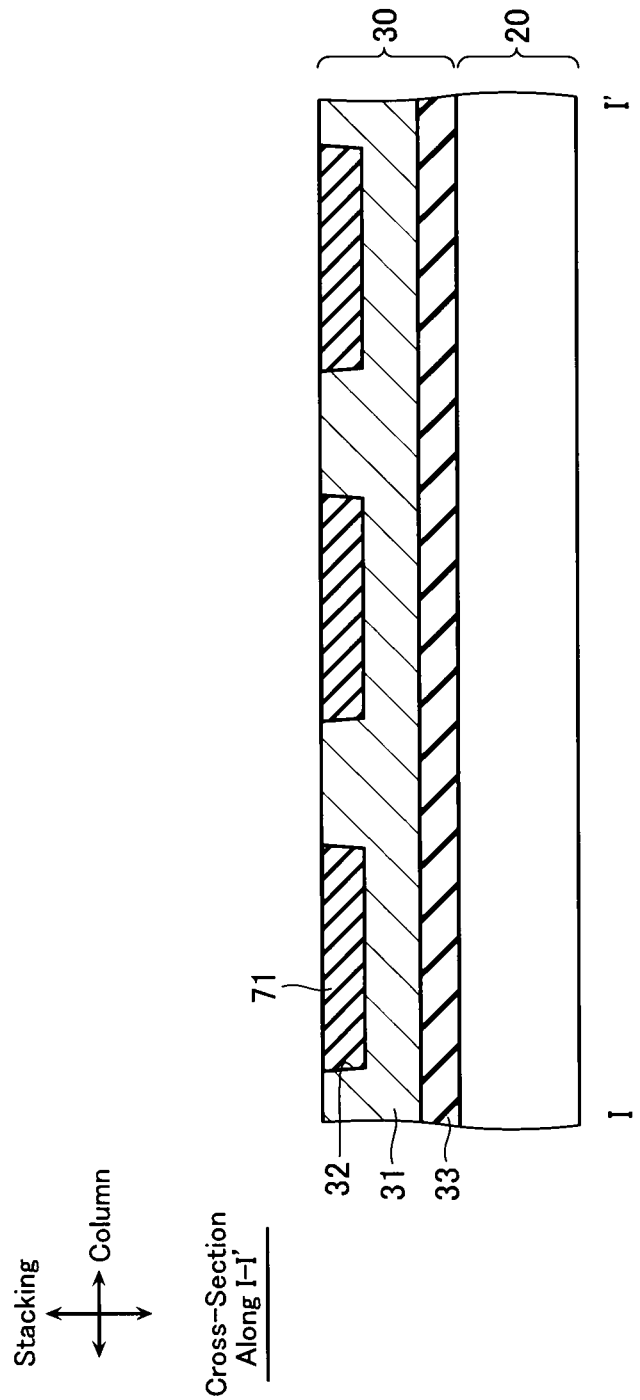
FIG. 7B is a cross-sectional view taken along the line I-I' of FIG. 7A.

First, silicon oxide (SiO$_2$) and polysilicon (poly-Si) are deposited on the substrate 20 to form the insulating layer 33 and the back gate conductive layer 31, as shown in FIGS. 7A and 7B. Then, the back gate layer 31 in the memory region AR1 is dug out to a certain depth to form the back gate hole 32 by etching or the like. Next, silicon nitride (SiN) is deposited to fill the back gate hole 32, thereby forming a sacrifice layer 71.

Figure 8B:
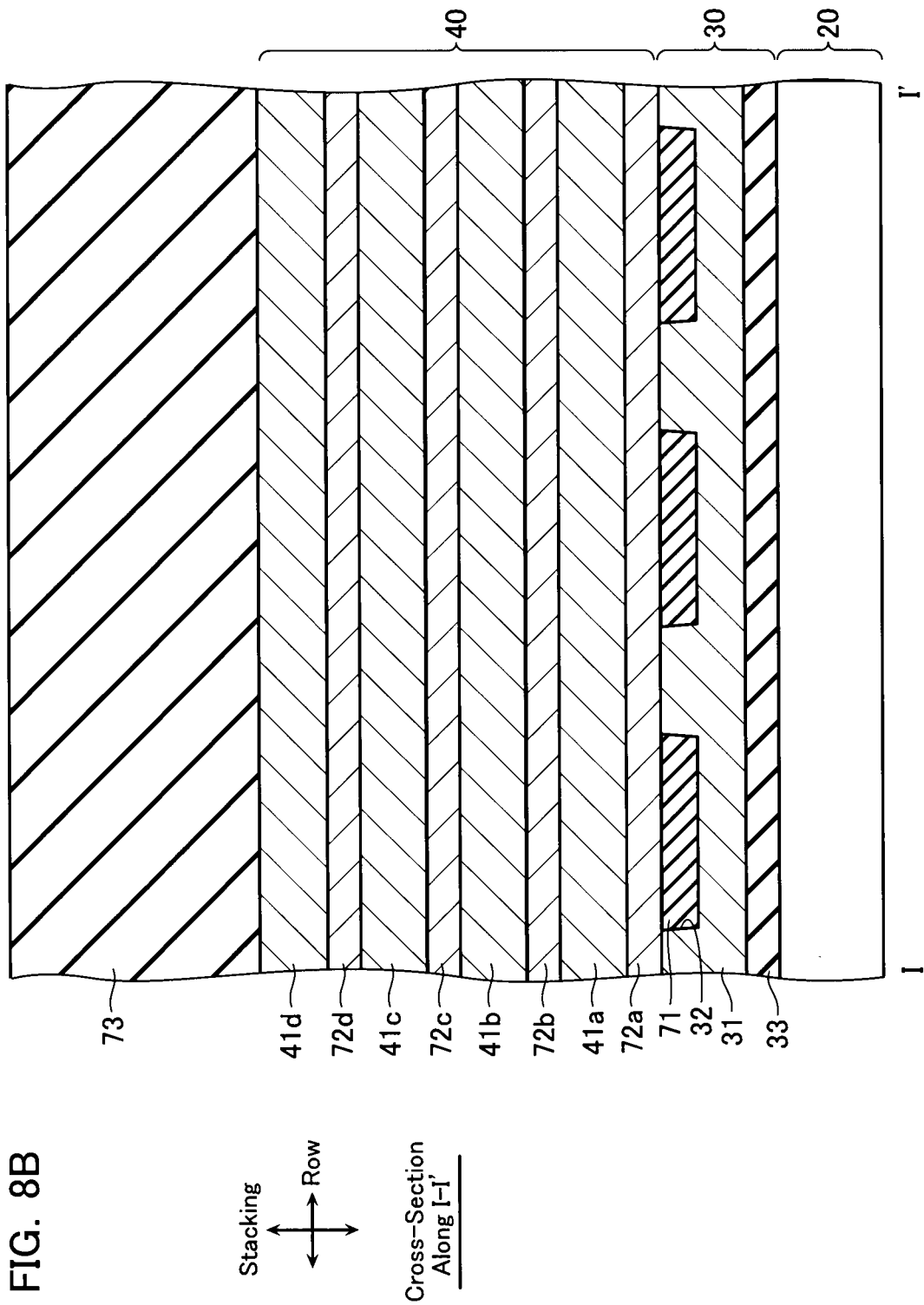
FIG. 8B is a cross-sectional view taken along the line I-I' of FIG. 8A.

Subsequently, LPCVD (Low Pressure Chemical Vapor Deposition) is used to form sacrifice layers 72*a*-72*d* and the word line conductive layers 41*a*-41*d* alternately on an upper portion of the back gate conductive layer 31 and sacrifice layer 71, as shown in FIGS. 8A and 8B. The LPCVD alternately uses silane (SiH$_4$) gas and a mixed gas of silane and boron trichloride (BCl$_3$). As a result, the sacrifice layers 72*a*-72*d* are configured by non-doped amorphous silicon that does not include boron (impurity), and the word line conductive layers 41*a*-41*d* are configured by amorphous silicon that does include boron (impurity).

Next, silicon oxide (SiO$_2$) is deposited to form an insulating layer 73 acting as a mask, as shown in FIGS. 8A and 8B.

Figure 9A:
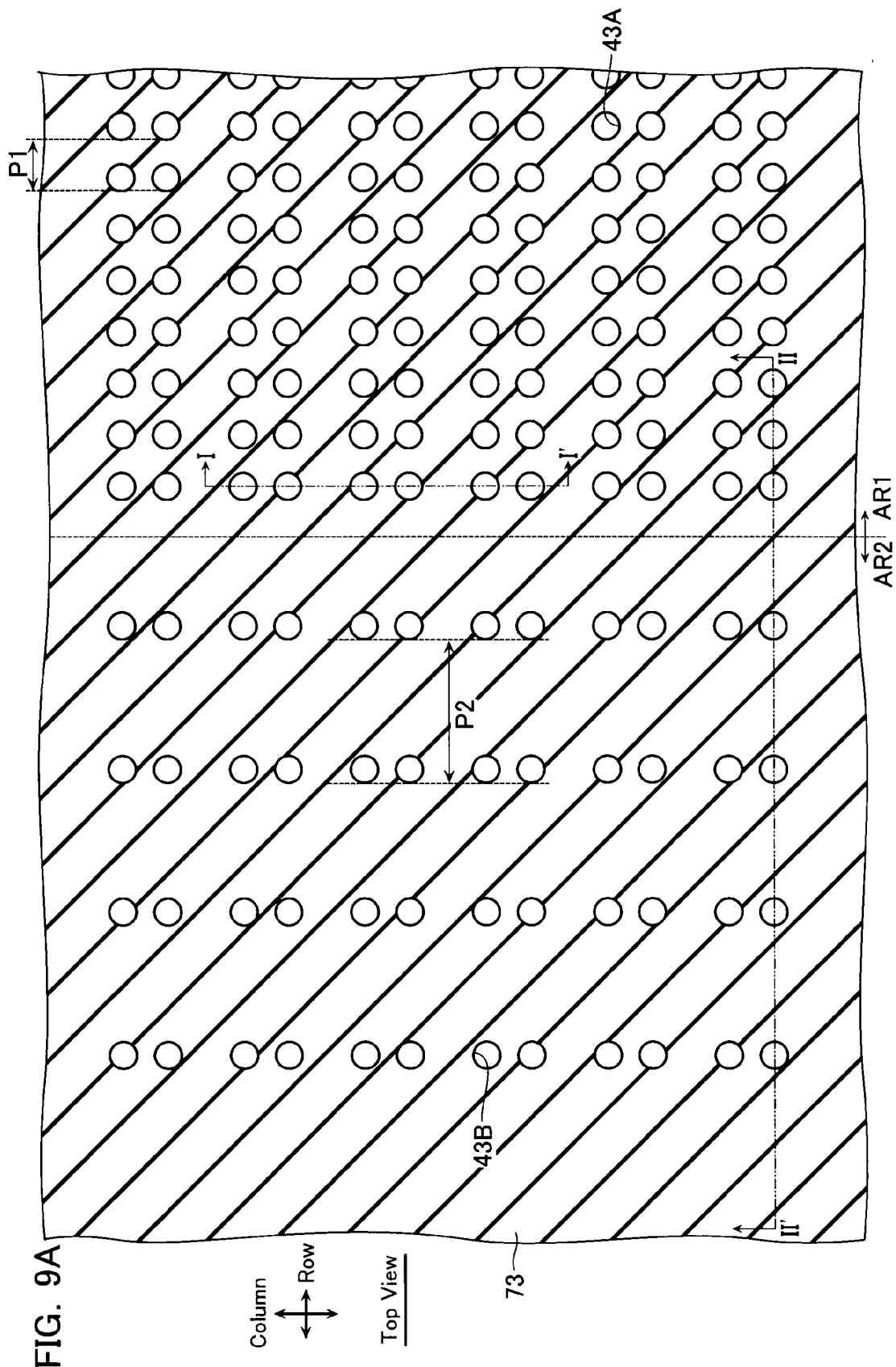
FIG. 9A is a top view showing a manufacturing process of the nonvolatile semiconductor memory device 100 in accordance with the embodiment.

Then, the memory hole 43A and the dummy hole 43B are formed penetrating the word line conductive layers 41*a*-41*d* and the sacrifice layers 72*a*-72*d*, as shown in FIGS. 9A-9C. In the memory region AR1, the memory holes 43A are formed in a matrix having the first pitch P1 in the row direction and a certain pitch in the column direction. Moreover, the memory hole 43A is formed at a position aligning with the two ends of the back gate hole 32. In the peripheral region AR2, the dummy holes 43B are formed in a matrix having the second pitch P2 (P2>P1) in the row direction and a certain pitch in the column direction.

Figure 10A:
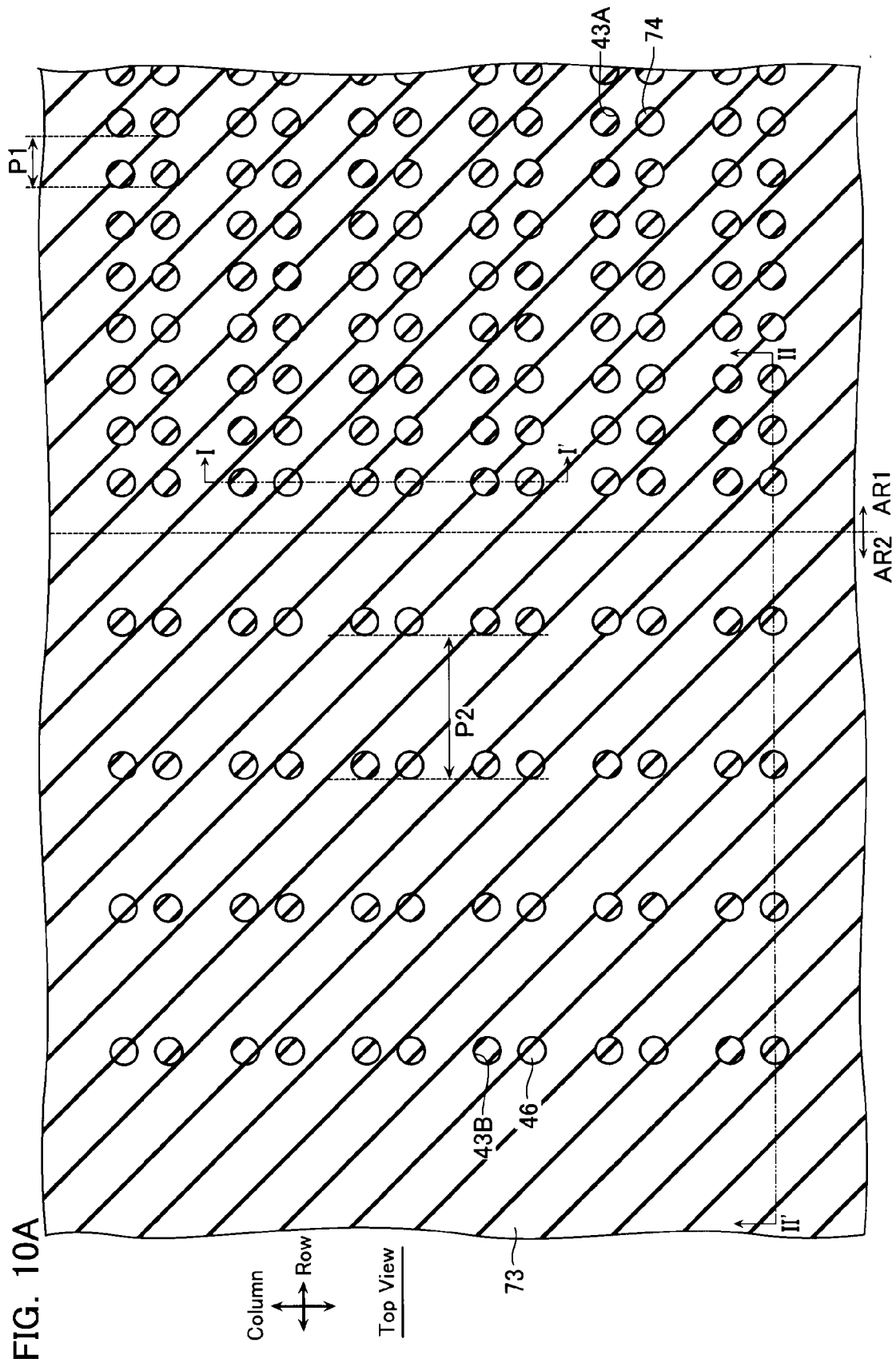
FIG. 10A is a top view showing a manufacturing process of the nonvolatile semiconductor memory device 100 in accordance with the embodiment.

Next, silicon nitride (SiN) is deposited so as to fill the memory hole 43A and the dummy hole 43B, as shown in FIGS. 10A-10C. Through this process, a columnar layer 74 is formed in the memory hole 43A, and the columnar layer 46 is formed in the dummy hole 43B.

Figure 11A:
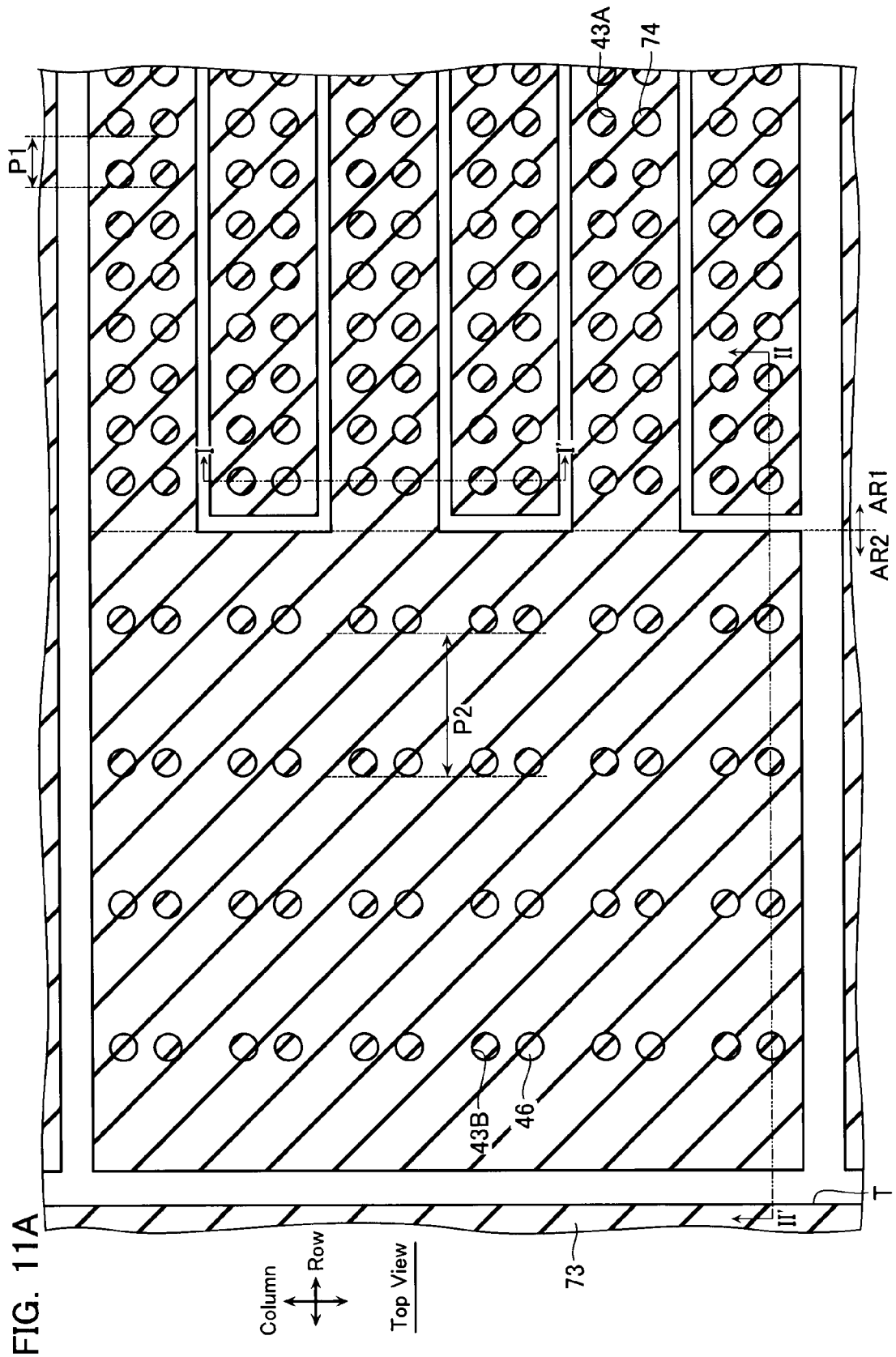
FIG. 11A is a top view showing a manufacturing process of the nonvolatile semiconductor memory device 100 in accordance with the embodiment.
Figure 11C:
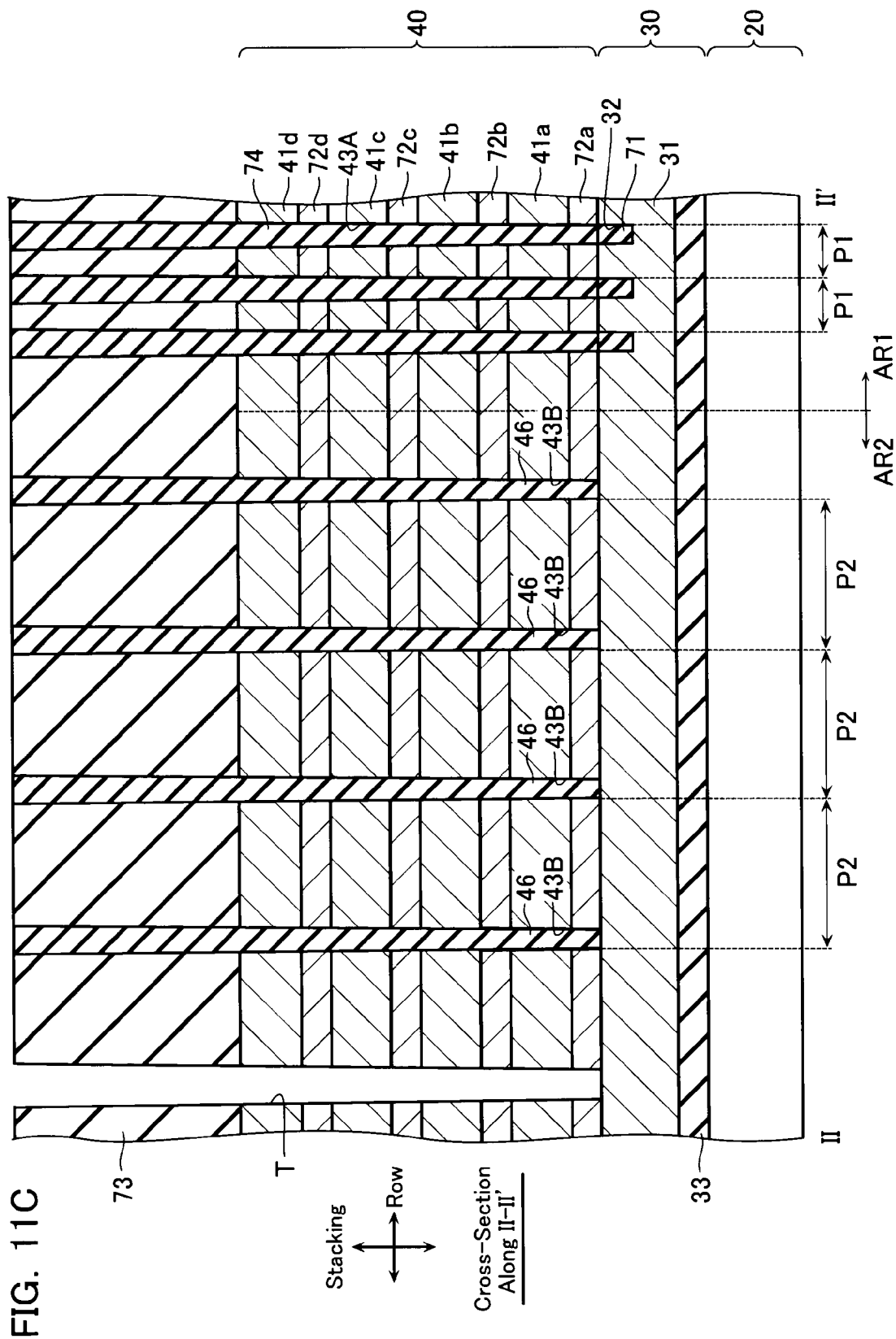
FIG. 11C is a cross-sectional view taken along the line II-II' of FIG. 11A.

Subsequently, the trench T penetrating the word line conductive layers 41*a*-41*d* and the sacrifice layers 72*a*-72*d* is formed, as shown in FIGS. 11A-11C. The trench T is formed dividing the word line conductive layers 41*a*-41*d* in the memory region AR1 in a comb shape.

Figure 12A:
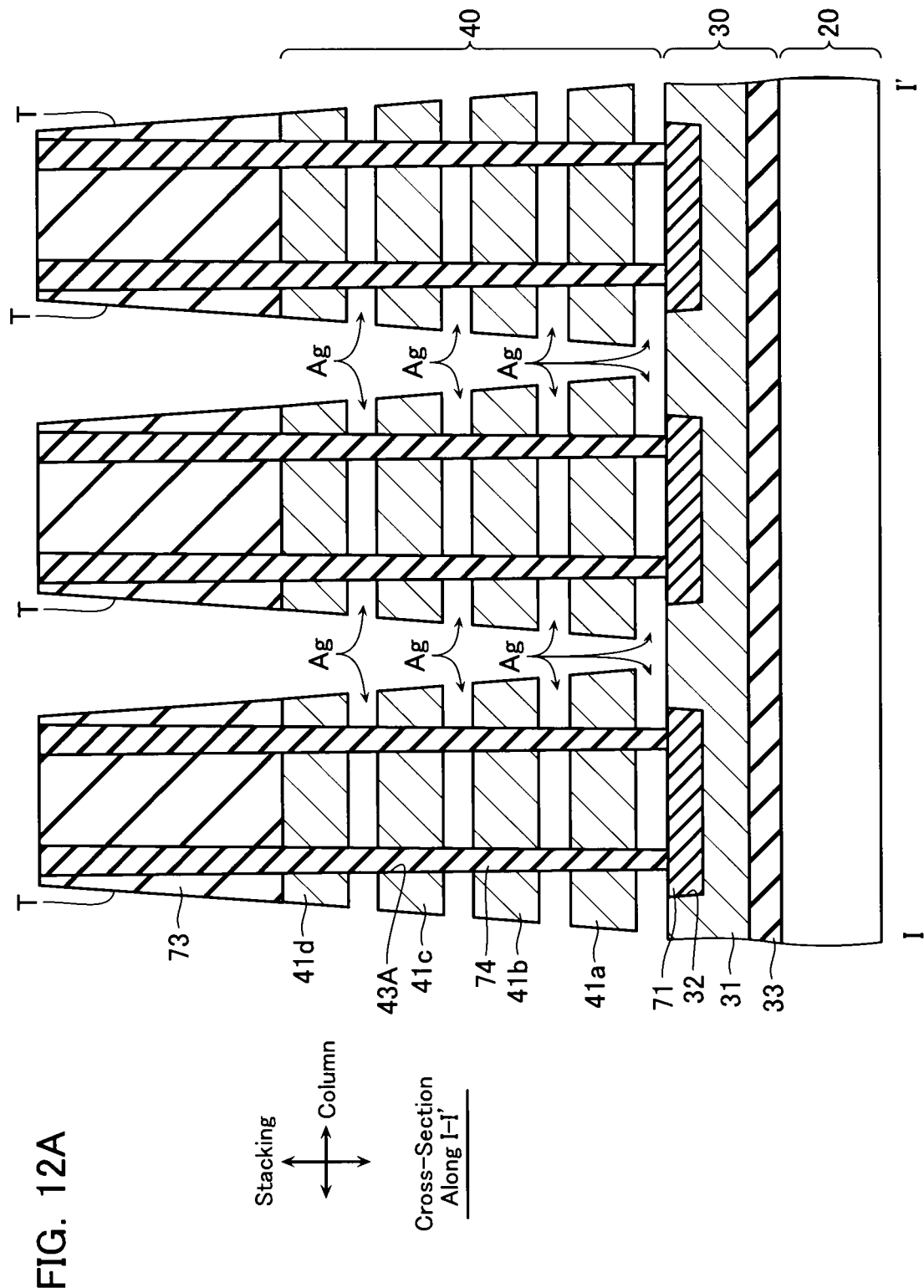
FIG. 12A is a cross-sectional view taken along the line I-I' of FIG. 11A.

Next, the sacrifice layers 72*a*-72*d* are removed via the trench T to form an air gap Ag in the removed portion, as shown in FIGS. 12A and 12B.

Figure 13A:
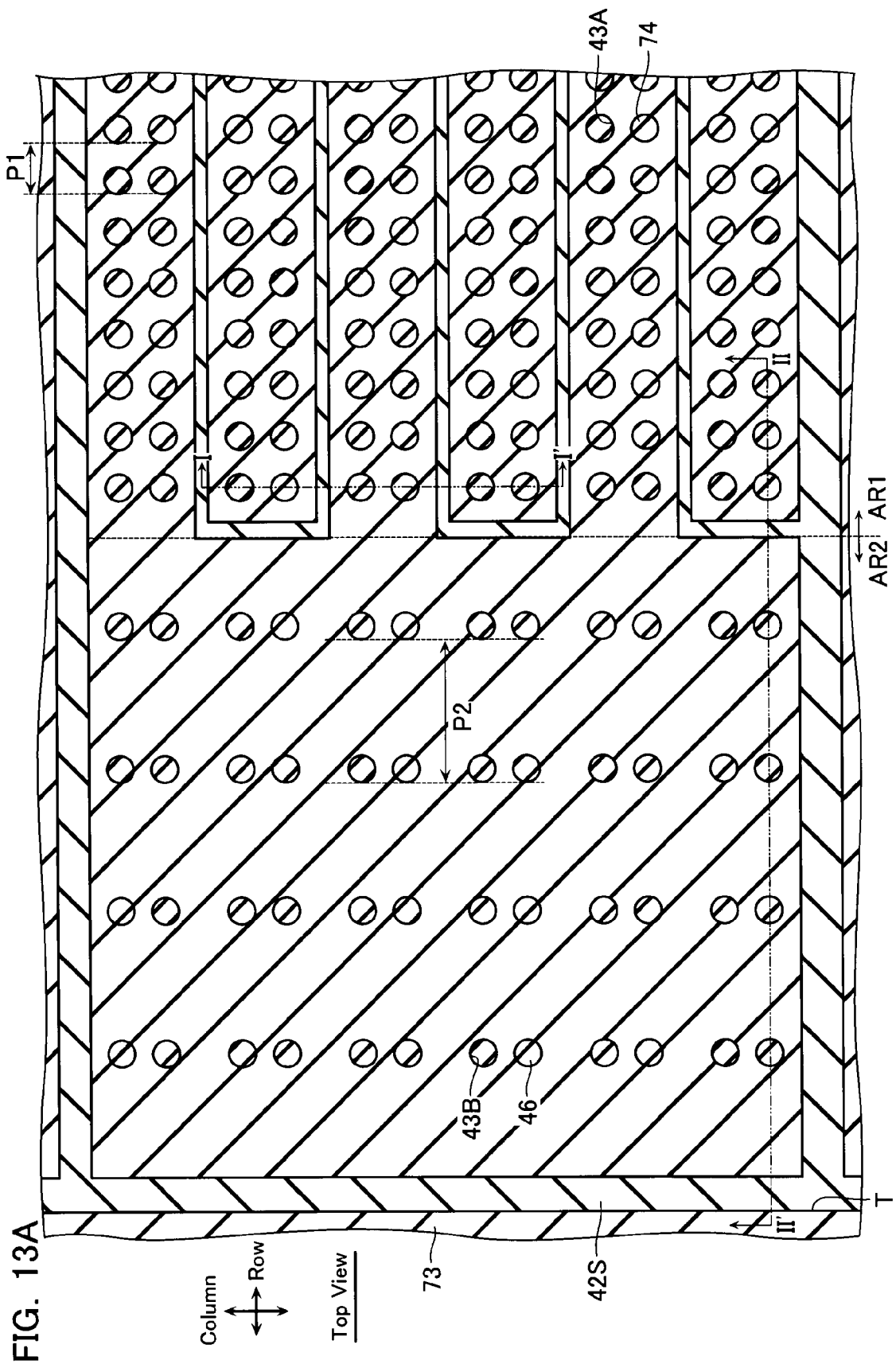
FIG. 13A is a top view showing a manufacturing process of the nonvolatile semiconductor memory device 100 in accordance with the embodiment.
Figure 13B:
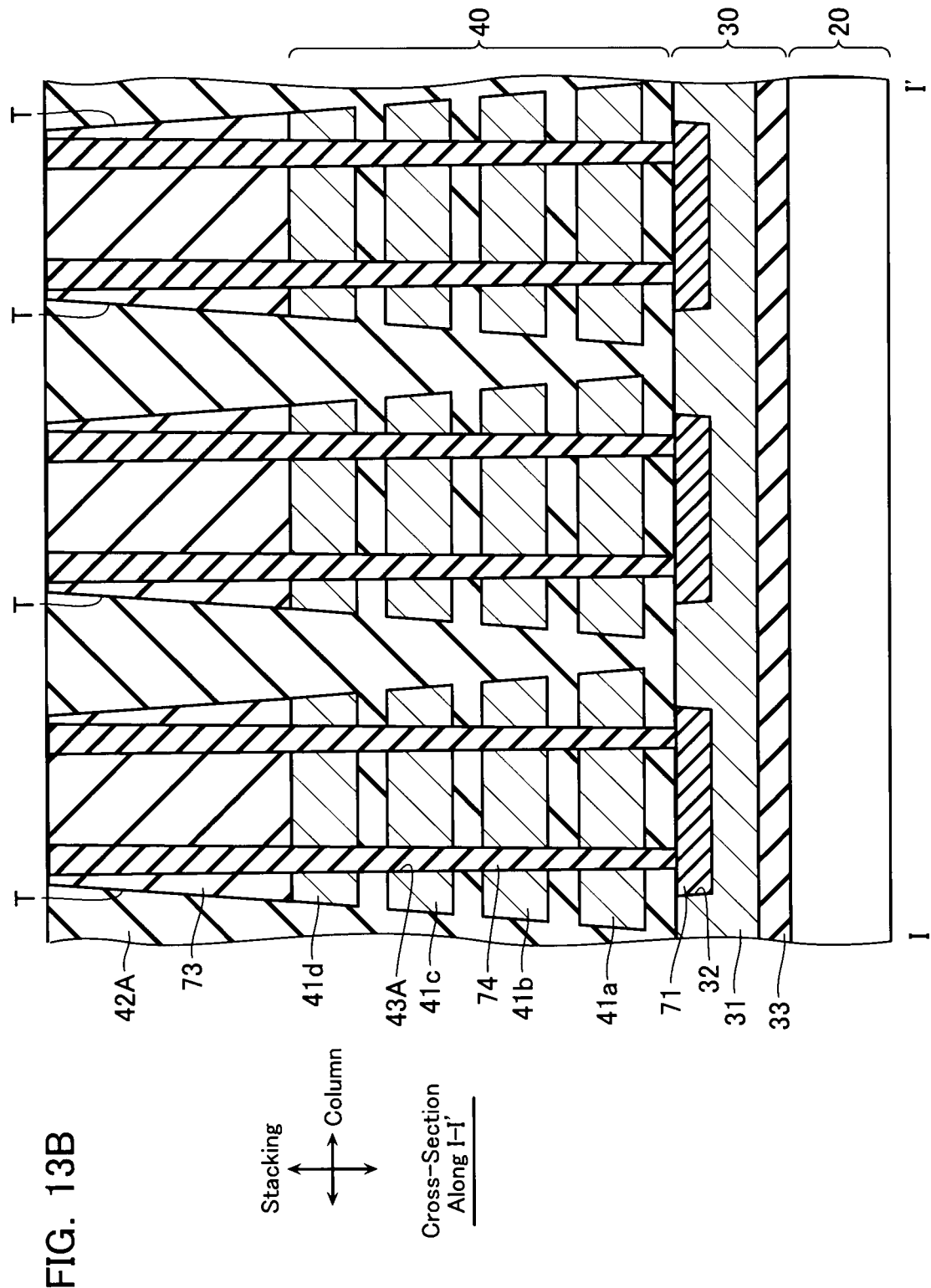
FIG. 13B is a cross-sectional view taken along the line I-I' of FIG. 13A.
Figure 13C:
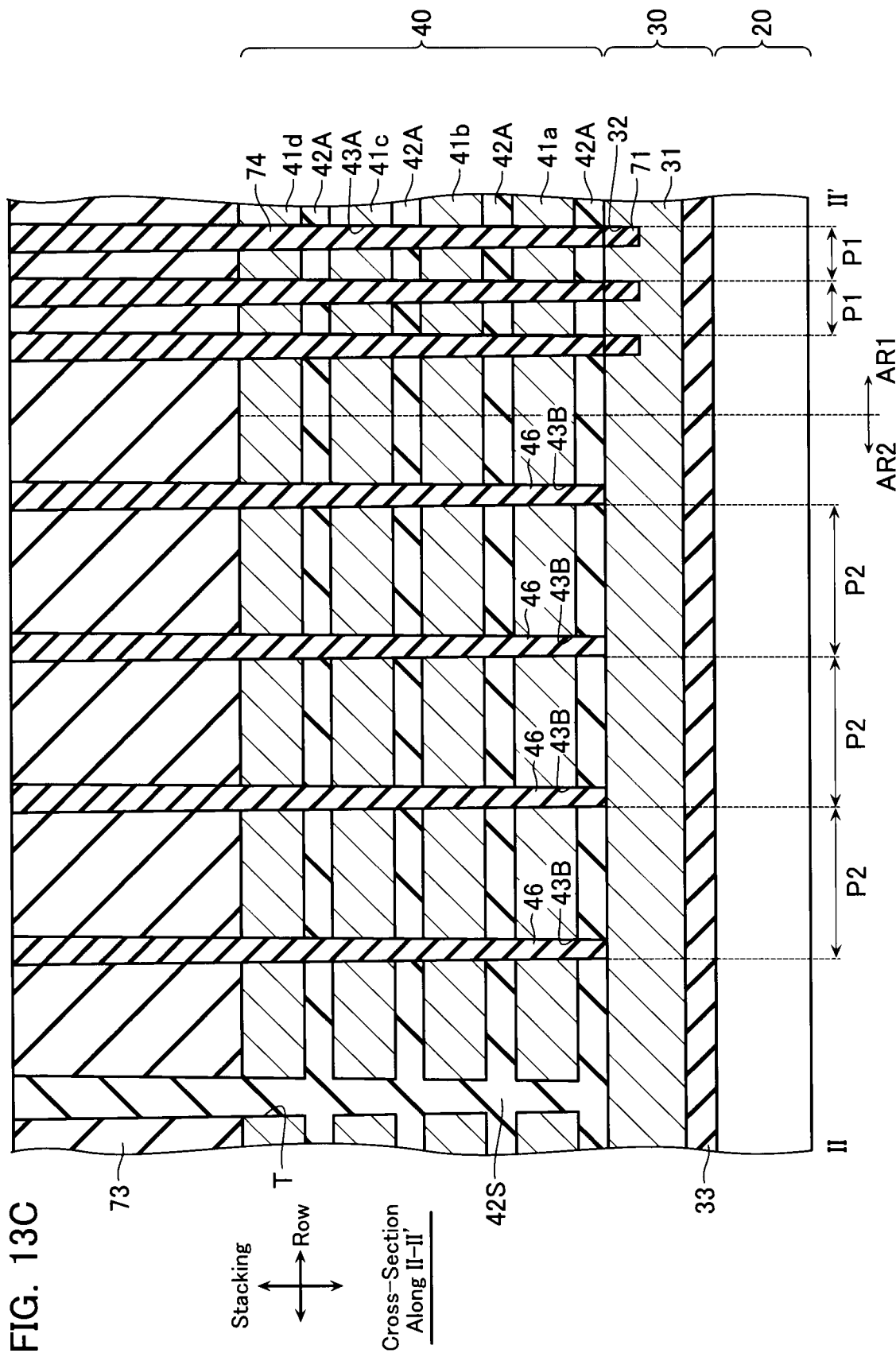
FIG. 13C is a cross-sectional view taken along the line II-II' of FIG. 13A.

Then, silicon oxide (SiO$_2$) is deposited so as to fill the air gap Ag and the trench T, thereby forming the insulating layers 42A and 42S, as shown in FIGS. 13A-13C. The insulating layer 42A is formed between the word line conductive layers 41*a*-41*d*. The insulating layer 42S is formed so as to fill the trench T.

Figure 14B:
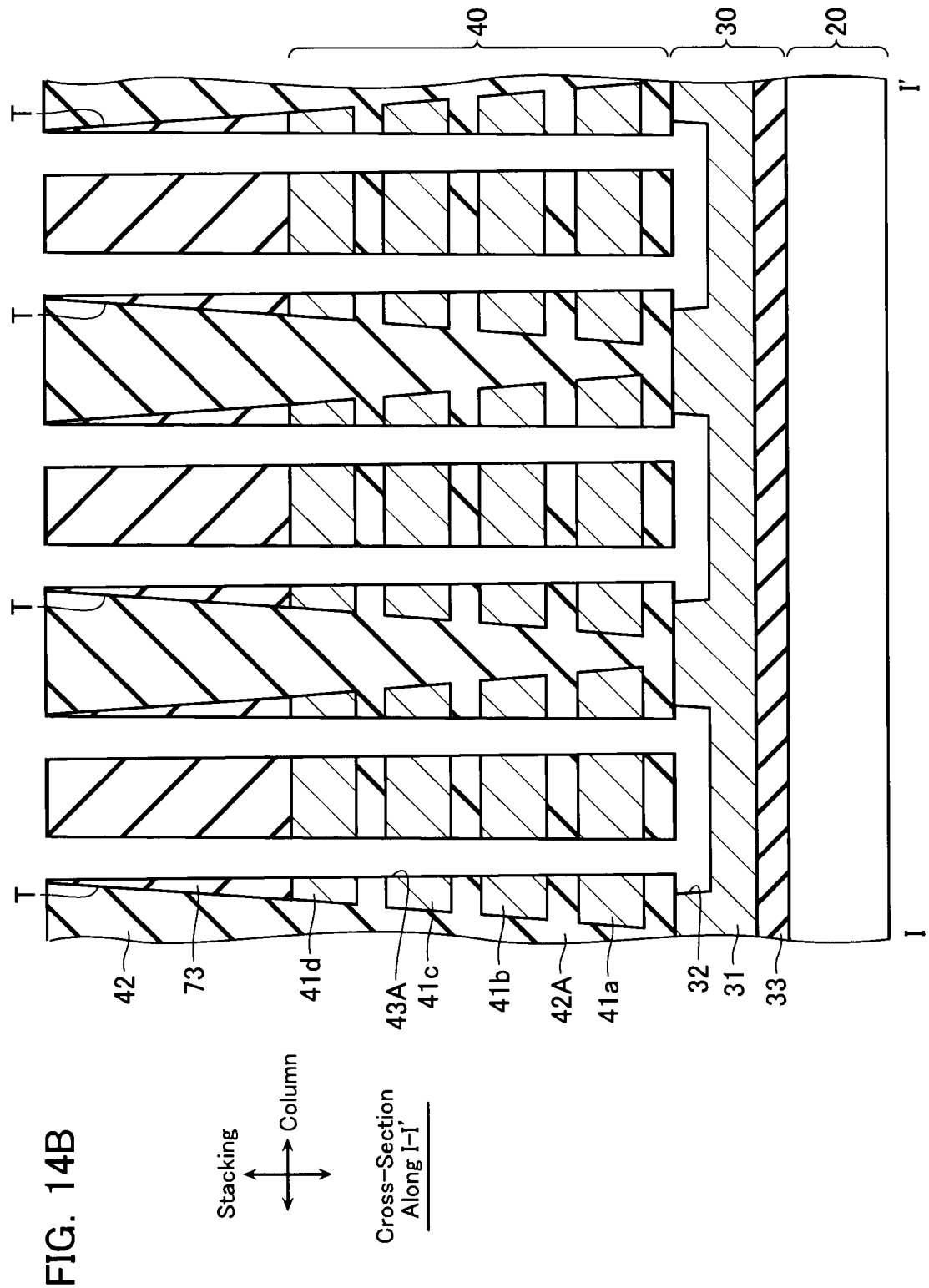
FIG. 14B is a cross-sectional view taken along the line I-I' of FIG. 14A.

Next, the columnar layer 74 in the memory region AR1 is removed to re-form the memory hole 43A, as shown in FIGS. 14A and 14B. Then, the sacrifice layer 71 is removed via the memory hole 43A to re-form the back gate hole 32.

Figure 15A:
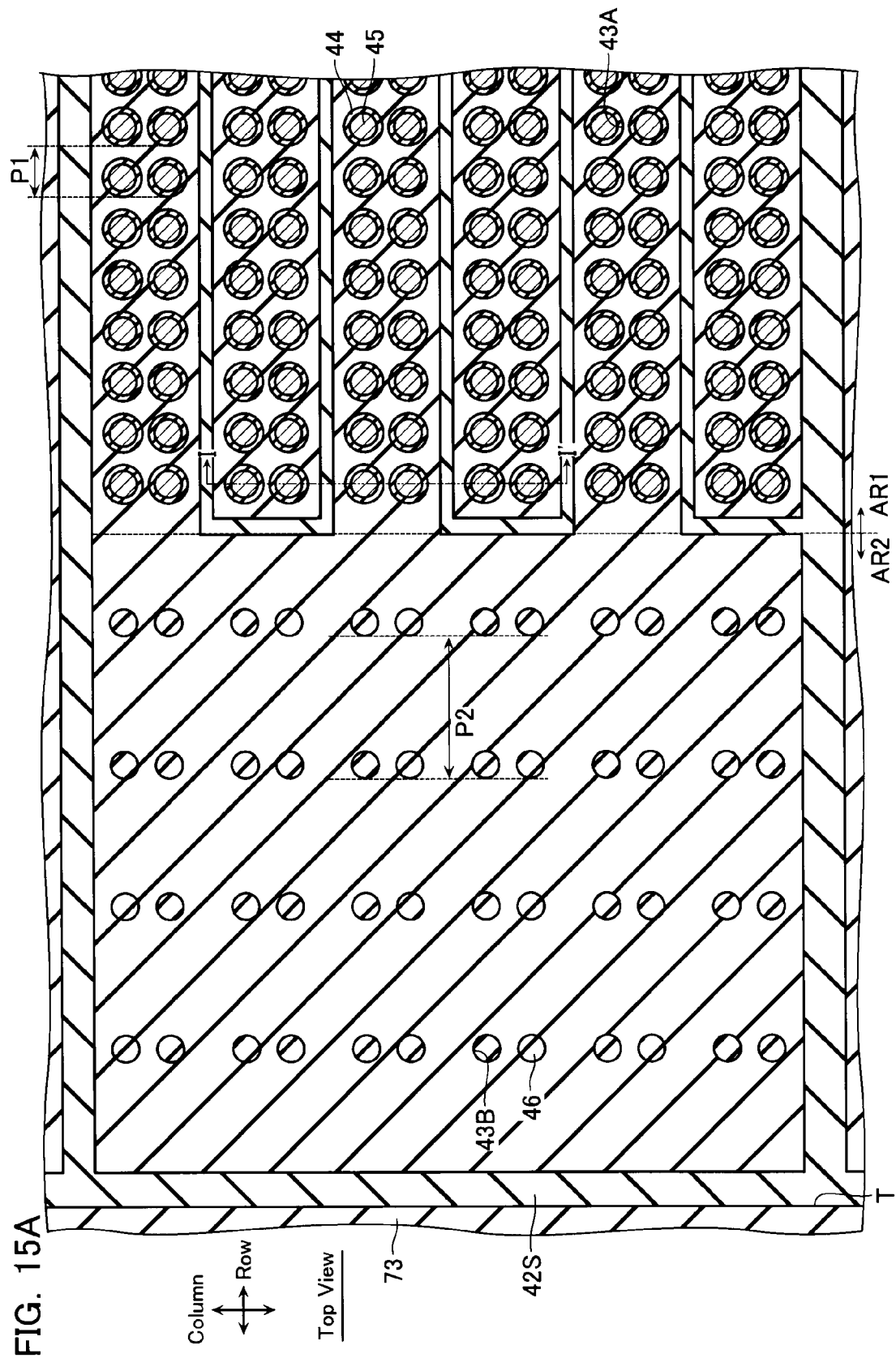
FIG. 15A is a top view showing a manufacturing process of the nonvolatile semiconductor memory device 100 in accordance with the embodiment.
Figure 15B:
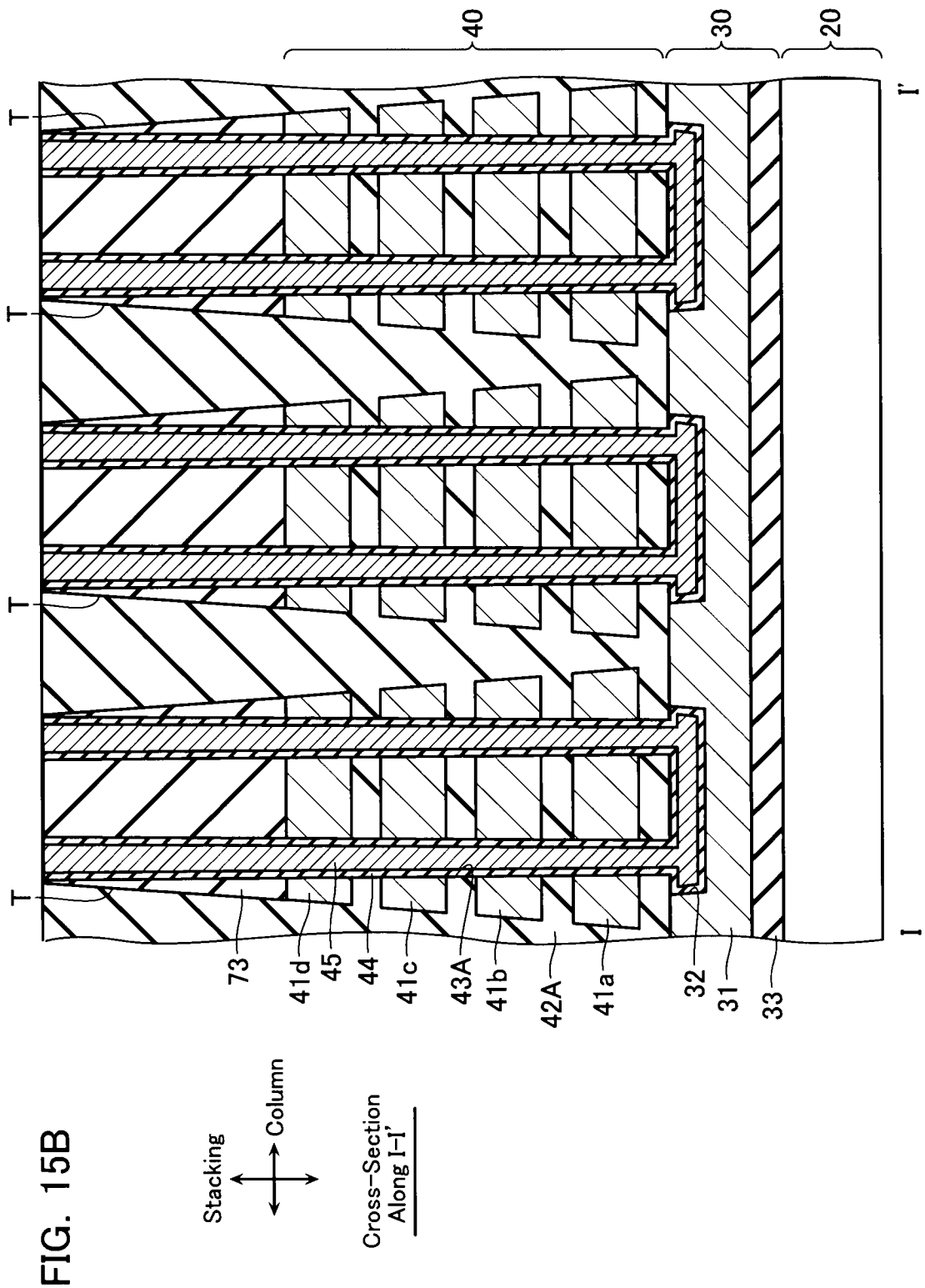
FIG. 15B is a cross-sectional view taken along the line I-I' of FIG. 15A.

Subsequently, silicon oxide (SiO$_2$), silicon nitride (SiN), and silicon oxide (SiO$_2$) are sequentially deposited on a side surface of the memory hole 43A and the back gate hole 32 in the memory region AR1, thereby forming the memory gate insulating layer 44, as shown in FIGS. 15A and 15B. Then, polysilicon (poly-Si) is deposited so as to fill the memory hole 43A and the back gate hole 32, thereby forming the U-shaped semiconductor layer 45.

Figure 16A:
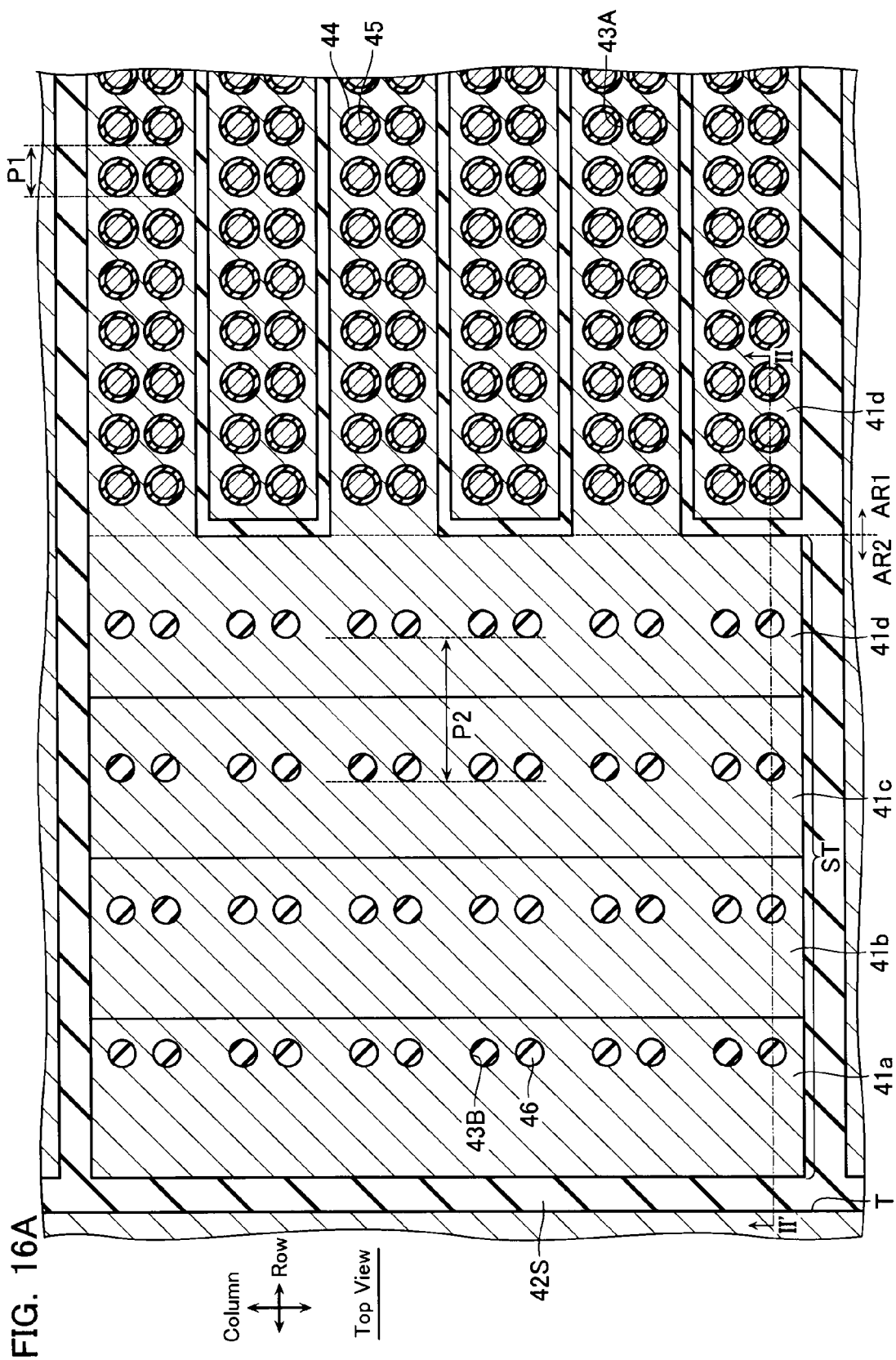
FIG. 16A is a top view showing a manufacturing process of the nonvolatile semiconductor memory device 100 in accordance with the embodiment.

Next, resist is deposited on the word line conductive layers 41*a*-41*d* in the peripheral region AR2, as shown in FIGS. 16A and 16B. Then, etching is performed on the word line conductive layers 41*a*-41*d* while slimming the resist, thereby forming the stepped portion ST. In these processes shown in FIGS. 16A and 16B, the conductive layers 41*e*-41*j*, which are a portion of the word line conductive layers 41*a*-41*d*, are left remaining in the region shaded, during etching, by the columnar layer 46. Moreover, the conductive layers 41*k* and 41*l*, which are a portion of the word line conductive layers 41*a*-41*d*, are left remaining in the region shaded, during etching, by the insulating layer 42S filling the trench T.

Then, subsequent to the processes shown in FIGS. 16A and 16B, silicon oxide (SiO$_2$) is deposited to an upper surface of the word line conductive layer 41*d*, thereby forming the insulating layer 42B. Upon execution of the above-described processes, formation of the memory transistor layer 40 is completed. Note that heat treatment is applied to the word line conductive layers 41*a*-41*d*, rendering them as polysilicon (poly-Si).

In the method of manufacturing the nonvolatile semiconductor memory device 100 in accordance with the embodiment, the word line conductive layers 41*a*-41*d* and the sacrifice layers 72*a*-72*d* are both configured by amorphous silicon. The word line conductive layers 41*a*-41*d* and the sacrifice layers 72*a*-72*d* can thus be formed continuously using a single depositing device, thereby increasing yield.

A comparative example is here considered in which the word line conductive layers 41*a*-41*d* are configured by amorphous silicon and sacrifice layers are configured by silicon oxide. In the case of this comparative example, etching rates of the word line conductive layers 41*a*-41*d* and the sacrifice layers differ greatly. It is thus difficult in the comparative example to form a memory hole 43 in one lot so as to penetrate the word line conductive layers 41*a*-41*d* and the sacrifice layers. In contrast, in the above-described embodiment, the word line conductive layers 41a-41d and the sacrifice layers 72a-72d are both configured by amorphous silicon, and the etching rates are substantially the same. The memory hole 43A can thus be formed in one lot so as to penetrate the word line conductive layers 41a-41d and the sacrifice layers 72a-72d.

Furthermore, in the process for removing the sacrifice layers 72a-72d, the columnar layers 74 and 46 are formed in the memory region AR1 and the peripheral region AR2 (stepped portion ST). The columnar layers and 46 thus prevent collapse of the word line conductive layers 41a-41d and allow the structure of the word line conductive layers 41a-41d to be maintained even when the sacrifice layers 72a-72d are removed forming the air gap Ag. For example, in the case that the columnar layers 74 and 46 are not formed, there is a risk that sagging of the word line conductive layers 41a-41d causes the word line conductive layers 41a-41d to come into contact with each other resulting in a short circuit. That is, the above-described embodiment enables suppression of a short circuit occurring in the stepped portion ST.

Moreover, the columnar portion 45A (memory hole 43A) is formed in the memory region AR1 so as to have the first pitch P1 in the row direction, and the columnar portion 46 (dummy hole 43B) is formed in the peripheral region AR2 so as to have the second pitch P2 in the row direction, the second pitch P2 being greater than the first pitch P1. The columnar portions 45A (memory strings MS) can thus be formed with high density in the memory region AR1. Further, the contact plug layer 64 can be formed in the peripheral region AR2 without hindrance due to the columnar layer 46.

In addition, the contact plug layer 64 in the above-described embodiment is formed separated from the conductive layers 41e-41l shorted by any of the word line conductive layers 41a-41d. As a result, there is no occurrence of a short circuit between the word line conductive layers 41a-41d due to the contact plug layer 64 and the conductive layers 41e-41l.

[Other Embodiments]

While certain embodiments of the invention have been described, these embodiments have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

For example, in the above-described embodiment, the memory gate insulating layer 44 and the U-shaped semiconductor layer 45 are formed by first filling the memory hole 43A with the columnar layer 74, and then removing the columnar layer 45A. However, the memory gate insulating layer 44 and the U-shaped semiconductor layer 45 may be formed directly in the memory hole 43A without forming the columnar layer 74.

For example, in the above-described embodiment, the word line conductive layers 41a-41d are formed in a comb shape, but may be formed in stripes along the memory region AR1 and the peripheral region AR2. For example, the above-described embodiment has a configuration in which the memory region AR1 is provided with the U-shaped semiconductor layer 45, but may have a structure such as that disclosed in the Japanese Patent Application No. 2006-86674, filed on Mar. 27, 2006, and the American patent application Ser. No. 11/654,551, filed on Jan. 18, 2007, the entire contents of which are incorporated herein by reference, in which the memory region AR1 is provided with an I-shaped semiconductor layer.

What is claimed is:

1. A nonvolatile semiconductor memory device including a first region having a plurality of electrically rewritable memory cells disposed therein, and a second region adjacent to the first region, the nonvolatile semiconductor memory device comprising:
    a plurality of first conductive layers stacked in the first region and the second region and functioning as control electrodes of the memory cells in the first region, the plurality of first conductive layers including a stepped portion in the second region, positions of ends of the plurality of first conductive layers being different in the stepped portion;
    a semiconductor layer surrounded by the first conductive layers in the first region, including a first columnar portion extending in a stacking direction, and functioning as a body of the memory cells;
    a charge storage layer formed between the first conductive layers and a side surface of the first columnar portion and configured to enable storage of a charge and thereby retain data of the memory cells; and
    an insulating columnar layer surrounded by the first conductive layers in the stepped portion, and including a second columnar portion extending in the stacking direction and comprising an insulator.

2. The nonvolatile semiconductor memory device according to claim 1,
    wherein the semiconductor layer is disposed having a first pitch in a first direction orthogonal to the stacking direction, and
    wherein the insulating columnar layer is disposed having a second pitch in the first direction, the second pitch being greater than the first pitch.

3. The nonvolatile semiconductor memory device according to claim 1, further comprising:
    a plurality of second conductive layers formed in the same layer as the first conductive layers and positioned on an upper portion of each of steps of the stepped portion; and
    a contact layer extending in the stacking direction from the first conductive layers,
    wherein the plurality of second conductive layers are formed in a periphery of the insulating columnar layer and are formed such that at least one of the plurality of second conductive layers is in contact with at least one of the first conductive layers, and
    wherein the contact layer is provided separated from the at least one of the plurality of second conductive layers in contact with the at least one of the first conductive layers.

4. The nonvolatile semiconductor memory device according to claim 3, further comprising:
    a wall insulating layer formed surrounding a periphery of the first conductive layers; and
    a plurality of third conductive layers formed surrounding the wall insulating layer and formed such that at least one of the plurality of third conductive layers is in contact with at least one of the first conductive layers,
    wherein the contact layer is provided separated from the third conductive layers.

5. The nonvolatile semiconductor memory device according to claim 1,
    wherein the insulating columnar layer is formed in a tapered shape such that a diameter of the insulating columnar layer becomes gradually smaller from an upper side to a lower side of the insulating columnar layer.

6. The nonvolatile semiconductor memory device according to claim 1,
wherein the insulating columnar layer is disposed in a matrix in the first direction and a second direction orthogonal to the first direction.

7. The nonvolatile semiconductor memory device according to claim 1, further comprising a wall insulating layer formed surrounding a periphery of the first conductive layers,
wherein the second columnar portion is higher in the stacking direction than the wall insulating layer in the second region.

8. The nonvolatile semiconductor memory device according to claim 1,
wherein the plurality of first conductive layers are divided in a comb shape in the first region.

9. The nonvolatile semiconductor memory device according to claim 1,
wherein the first columnar portion is higher in the stacking direction than the second columnar portion.

10. The nonvolatile semiconductor memory device according to claim 1,
wherein, the semiconductor layer is disposed having a third pitch in a second direction orthogonal to the stacking direction an the first direction, and
the insulating columnar layer is disposed having the third pitch in the second direction.

11. A nonvolatile semiconductor memory device including a first region having a plurality of electrically rewritable memory cells disposed therein, and a second region adjacent to the first region, the nonvolatile semiconductor memory device comprising:
a plurality of first conductive layers stacked in the first region and the second region and including a stepped portion in the second region, positions of ends of the plurality of first conductive layers being different in the stepped portion;
an insulating columnar layer surrounded by the first conductive layers in the stepped portion, and including a second columnar portion extending in the stacking direction and comprising an insulator;
a plurality of second conductive layers formed in the same layer as the first conductive layers and positioned on an upper portion of each of steps of the stepped portion; and
a contact layer extending in the stacking direction from the first conductive layers,
the plurality of second conductive layers being formed in a periphery of the insulating columnar layer and being formed such that at least one of the plurality of second conductive layers is in contact with at least one of the first conductive layers, and
the contact layer being provided separated from the at least one of the plurality of second conductive layers in contact with the at least one of the first conductive layers.

12. The nonvolatile semiconductor memory device according to claim 11, further comprising:
a wall insulating layer formed surrounding a periphery of the first conductive layers; and
a plurality of third conductive layers formed surrounding the wall insulating layer and formed such that at least one of the plurality of third conductive layers is in contact with at least one of the first conductive layers,
wherein the contact layer is provided separated from the third conductive layers.

13. The nonvolatile semiconductor memory device according to claim 11,
wherein the insulating columnar layer is formed in a tapered shape such that a diameter of the insulating columnar layer becomes gradually smaller from an upper side to a lower side of the insulating columnar layer.

14. The nonvolatile semiconductor memory device according to claim 11,
wherein the insulating columnar layer is disposed in a matrix in the first direction and a second direction orthogonal to the first direction.

15. The nonvolatile semiconductor memory device according to claim 11, further comprising a wall insulating layer formed surrounding a periphery of the first conductive layers,
wherein the second columnar portion is higher in the stacking direction than the wall insulating layer in the second region.

16. The nonvolatile semiconductor memory device according to claim 11,
wherein the plurality of first conductive layers are divided in a comb shape in the first region.

17. The nonvolatile semiconductor memory device according to claim 11,
wherein the first columnar portion is higher in the stacking direction than the second columnar portion.

* * * * *